US011532610B2

(12) United States Patent
Shen

(10) Patent No.: US 11,532,610 B2
(45) Date of Patent: Dec. 20, 2022

(54) ELECTROSTATIC DISCHARGE PROTECTION STRUCTURE AND ELECTROSTATIC DISCHARGE PROTECTION CIRCUIT WITH LOW PARASITIC CAPACITANCE THEREOF

(71) Applicant: AMAZING MICROELECTRONIC CORP., New Taipei (TW)

(72) Inventor: Yu-Shu Shen, Chiayi County (TW)

(73) Assignee: Amazing Microelectronic Corp., New Taipei (TW)

( * ) Notice: Subject to any disclaimer, the term of this patent is extended or adjusted under 35 U.S.C. 154(b) by 252 days.

(21) Appl. No.: 16/910,598

(22) Filed: Jun. 24, 2020

(65) Prior Publication Data

US 2021/0407987 A1 Dec. 30, 2021

(51) Int. Cl.
*H01L 27/02* (2006.01)
*H01L 29/866* (2006.01)
*H02H 9/04* (2006.01)

(52) U.S. Cl.
CPC ...... *H01L 27/0262* (2013.01); *H01L 27/0255* (2013.01); *H01L 29/866* (2013.01); *H02H 9/046* (2013.01)

(58) Field of Classification Search
None
See application file for complete search history.

(56) References Cited

U.S. PATENT DOCUMENTS

| | | | |
|---|---|---|---|
| 7,804,670 B2 | 9/2010 | Reynders et al. | |
| 8,217,421 B2 * | 7/2012 | Chen | H01L 27/0259 257/175 |
| 8,431,999 B2 | 4/2013 | Shen et al. | |
| 8,785,971 B2 * | 7/2014 | Chuang | H01L 27/0296 257/E29.007 |
| 8,835,977 B2 | 9/2014 | Bobde et al. | |
| 10,354,990 B2 | 7/2019 | Bobde | |

(Continued)

FOREIGN PATENT DOCUMENTS

| | | |
|---|---|---|
| CN | 1881582 A | 12/2006 |
| CN | 101378193 A | 3/2009 |

(Continued)

OTHER PUBLICATIONS

A Search Report, which was issued by a Foreign Patent Office; the corresponding counterpart application No. being 11020424240.

*Primary Examiner* — Steven M Christopher
(74) *Attorney, Agent, or Firm* — Rosenberg, Klein & Lee

(57) ABSTRACT

An Electrostatic Discharge protection circuit with low parasitic capacitance is provided, comprising a first bipolar junction transistor and a first ESD power clamp device. The first bipolar junction transistor is an NPN type of bipolar junction transistor, including a base and an emitter commonly connected to an I/O terminal and a collector connected with the first ESD power clamp device. The first ESD power clamp device is further connected to ground, and can be a Zener diode, PNP type, NPN type of bipolar junction transistor or the like. When a positive ESD pulse is injected, an ESD protection path is consisting of the first bipolar junction transistor and the first ESD power clamp device. When a negative ESD pulse is injected, the ESD protection path is consisting of a parasitic silicon controlled rectifier, thereby reducing parasitic capacitance effectively.

18 Claims, 26 Drawing Sheets

(56) References Cited

U.S. PATENT DOCUMENTS

| | | | |
|---|---|---|---|
| 10,366,974 | B2 | 7/2019 | De Raad et al. |
| 10,944,255 | B2* | 3/2021 | Tseng .................. H01L 27/0255 |
| 2008/0203534 | A1 | 8/2008 | Xu et al. |
| 2009/0213506 | A1* | 8/2009 | Zhan .................... H01L 27/0262 |
| | | | 361/56 |
| 2015/0085407 | A1* | 3/2015 | Chen ..................... H01L 21/768 |
| | | | 438/328 |
| 2018/0342499 | A1* | 11/2018 | Mallikarjunaswamy .................... |
| | | | H01L 29/0649 |
| 2021/0159223 | A1* | 5/2021 | Mallikarjunaswamy .................... |
| | | | H01L 23/535 |
| 2021/0407987 | A1* | 12/2021 | Shen ..................... H01L 29/866 |

FOREIGN PATENT DOCUMENTS

| | | | |
|---|---|---|---|
| CN | 102263102 | A | 11/2011 |
| CN | 104465647 | A | 3/2015 |
| TW | 577166 | B | 2/2004 |
| TW | I444097 | B | 7/2014 |
| TW | 201635476 | A | 10/2016 |

\* cited by examiner

ELECTROSTATIC DISCHARGE PROTECTION STRUCTURE AND ELECTROSTATIC DISCHARGE PROTECTION CIRCUIT WITH LOW PARASITIC CAPACITANCE THEREOF

BACKGROUND OF THE INVENTION

Field of the Invention

The present invention relates to an Electrostatic Discharge (ESD) protection scheme. More particularly, the present invention is related to an ESD protection structure and its electrostatic discharge protection circuit with low parasitic capacitance thereof.

Description of the Prior Art

With rapid development of today's technology, integrated circuits have been widely applied in electronic devices. However, electrostatic discharge, ESD hereinafter, may occur everywhere during the phases of testing, assembly, installation, operation, etc., and cause damage to integrated circuits (ICs). Electrostatic discharge (ESD) is a phenomenon that releases and transfers charges between integrated circuit chips and external objects. Due to a large amount of charges being released in a short time, the energy from ESD is much higher than the bearing capacity of the chip, which may result in a temporary functional failure or even a permanent damage to the chip. During the process for manufacturing a chip, a wrist strap or an anti-static clothing can be used to reduce the damage from ESD. The chip having been manufactured is easily affected by ESD events between the chip and the external objects when the chip is used in various different environments. Therefore, an ESD protection device is provided in the chip to offer an electrostatic discharge path to protect the chip effectively, so that the reliability and lifetime of the integrated circuit chip is improved.

FIG. 1A shows a conventional ESD protection to a core circuit. As shown in FIG. 1A, ESD (Electrostatic discharge) protector 1 is one of the major necessities in the field of integrated circuits for preventing the device to be protected 2 from an ESD event, and has been well known by person skilled in the art. The device to be protected 2 such as core circuits, are prone to damages caused by the ESD event. In a conventional technical field, FIG. 1B shows a conventional diagram which uses a steering diode to conduct the ESD protection. The steering diode scheme employs a first diode D1 in series with a second diode D2 to conduct the ESD protection, in which the first diode D1 is connected between I/O and $V_{DD}$. The second diode D2 is connected between I/O and GND. A clamp circuit 101 is connected between GND and $V_{DD}$, and in parallel with the first diode D1 along with the second diode D2. FIG. 2 shows a cross sectional view of the conventional ESD protector in FIG. 1B scheme. As we can see, the junction capacitance of such prior scheme will be equal to the capacitance of the first diode D1 and the second diode D2, i.e. (D1+D2), resulting in an extremely high capacitance and an exorbitant outcome.

Therefore, on account of above, to overcome the above-mentioned problem, it should be obvious that there is indeed an urgent need for the professionals in the field for a new ESD protection circuit to be developed that can effectively solve the above mentioned problem occurring in the prior design and reduce the formal junction capacitance of the ESD protection circuit.

SUMMARY OF THE INVENTION

In order to overcome the above mentioned disadvantages, one major objective in accordance with the present invention is provided for a novel ESD protection circuit with low parasitic capacitance. By employing the proposed ESD protection circuit of the present invention, junctions of the ESD protection circuit structure can be well controlled such that the junction capacitance thereof can be effectively reduced, and the efficiency of the ESD protection circuit structure is still well maintained.

For achieving the above mentioned objectives, the present invention provides an ESD protection circuit with low parasitic capacitance, which comprises a first bipolar junction transistor (BJT) and a first ESD power clamp device. The ESD protection circuit with low parasitic capacitance is electrically connected between an I/O terminal and ground. The first bipolar junction transistor is an NPN type of bipolar junction transistor, including a base and an emitter of the first bipolar junction transistor are commonly connected to the I/O terminal. And a collector of the first bipolar junction transistor is electrically connected with the first ESD power clamp device. The first ESD power clamp device is connected between the collector of the first bipolar junction transistor and ground. Therefore, as a positive ESD pulse or a negative ESD pulse being injected into the I/O terminal, an ESD protection path is provided with low parasitic capacitance.

In one embodiment, the collector of the first bipolar junction transistor can be alternatively electrically connected to a high voltage level $V_{DD}$ or floating.

Therefore, when the positive ESD pulse is injected into the I/O terminal, the ESD protection path is formed consisting of the first bipolar junction transistor and the first ESD power clamp device. On the other hand, when the negative ESD pulse is injected into the I/O terminal, the ESD protection path is formed consisting of a parasitic silicon controlled rectifier (SCR), instead.

According to the embodiment of the present invention, the first ESD power clamp device can be a Zener diode, a PNP type of bipolar junction transistor, or an NPN type of bipolar junction transistor. In general, people skilled in the art are able to make modifications or variations according to the present invention without departing the spirits of the present invention, and yet still fall into the scope of the present invention.

Furthermore, according to yet an embodiment of the present invention, the first ESD power clamp device may also be replaced by a diode element, and a second ESD power clamp device is furthered connected in parallel with the diode element to provide a new ESD protection path. In practical, an anode of the diode element is electrically connected to ground, and a cathode of the diode element is electrically connected to the collector of the first bipolar junction transistor.

Based on such embodiment, when the positive ESD pulse is injected into the I/O terminal, the new ESD protection path is formed consisting of the first bipolar junction transistor and the second ESD power clamp device.

Similarly, when the negative ESD pulse is injected into the I/O terminal, the ESD protection path is formed merely consisting of a parasitic silicon controlled rectifier (SCR), whereby reduce its junction and parasitic capacitance.

And yet, one major objective in accordance with the present invention is also provided for a novel ESD protection structure with low parasitic capacitance. The ESD protection structure is connected between an I/O terminal and ground, comprising a first ESD protection circuit and a second ESD protection circuit.

The first ESD protection circuit comprises a first bipolar junction transistor (BJT) and a first ESD power clamp device, wherein the first bipolar junction transistor is an NPN type of bipolar junction transistor, including a base and an emitter of the first bipolar junction transistor being commonly connected to the I/O terminal. The first ESD power clamp device is connected to a collector of the first bipolar junction transistor.

The second ESD protection circuit comprises the first bipolar junction transistor (BJT) and the first ESD power clamp device, wherein the first bipolar junction transistor is an NPN type of bipolar junction transistor, including a base and an emitter of the first bipolar junction transistor of the second ESD protection circuit being commonly connected to the ground. The first ESD power clamp device of the second ESD protection circuit is connected to a collector of the first bipolar junction transistor of the second ESD protection circuit. The first ESD power clamp device of the first ESD protection circuit is connected to the first ESD power clamp device of the second ESD protection circuit, and the collector of the first bipolar junction transistor of the first ESD protection circuit is connected to the collector of the first bipolar junction transistor of the second ESD protection circuit. By such design manners, the electrostatic Discharge (ESD) protection structure forms a bi-directional design.

Similarly, the first ESD power clamp device of the ESD protection structure can be alternatively replaced by a diode element, and a second ESD power clamp device is furthered connected between the first ESD protection circuit and the second ESD protection circuit. An anode of the diode element is electrically connected to the second ESD power clamp device, and a cathode of the diode element is electrically connected to the collector of the first bipolar junction transistor.

As a result, it is apparent that the present invention discloses an electrostatic discharge protection technique, and more particularly to an ESD protection structure and its ESD protection circuit thereof with ultra low parasitic capacitance. Therefore, by employing such arrangements of the proposed present invention, junctions of the ESD protection circuit structure can be well controlled, and effective in solving the conventional issues generating in the prior arts as discussed earlier and decreasing its junction capacitance. And thus, it is believed that the present invention accordingly is advantageous of successfully reducing the parasitic capacitance as well.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
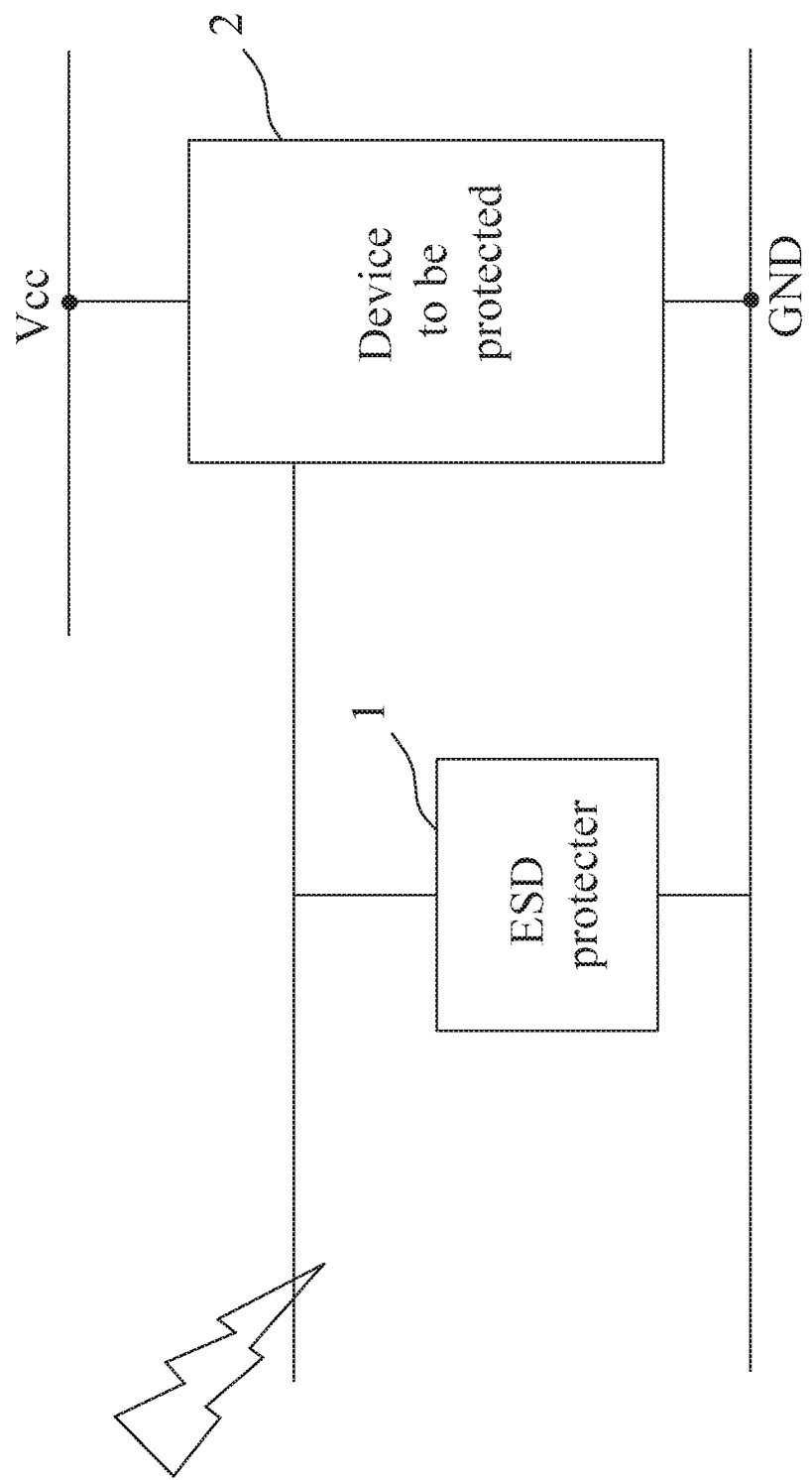
FIG. 1A shows a conventional ESD protection to a core circuit in prior arts.
Figure 1B:
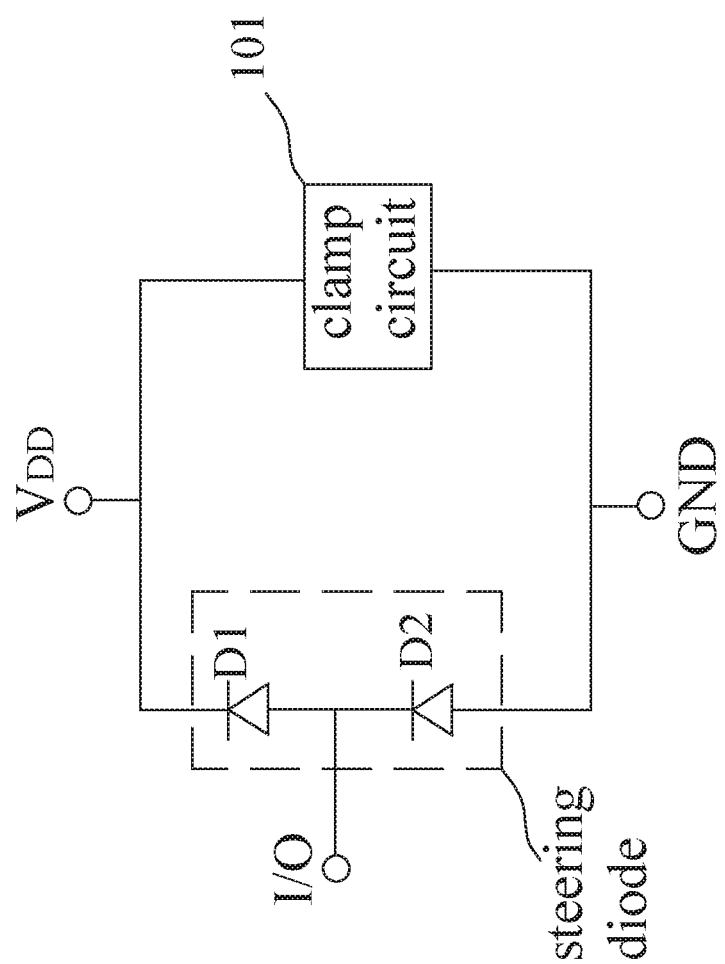
FIG. 1B shows a conventional diagram which uses a steering diode to conduct the ESD protection in prior arts.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

Figure 3:
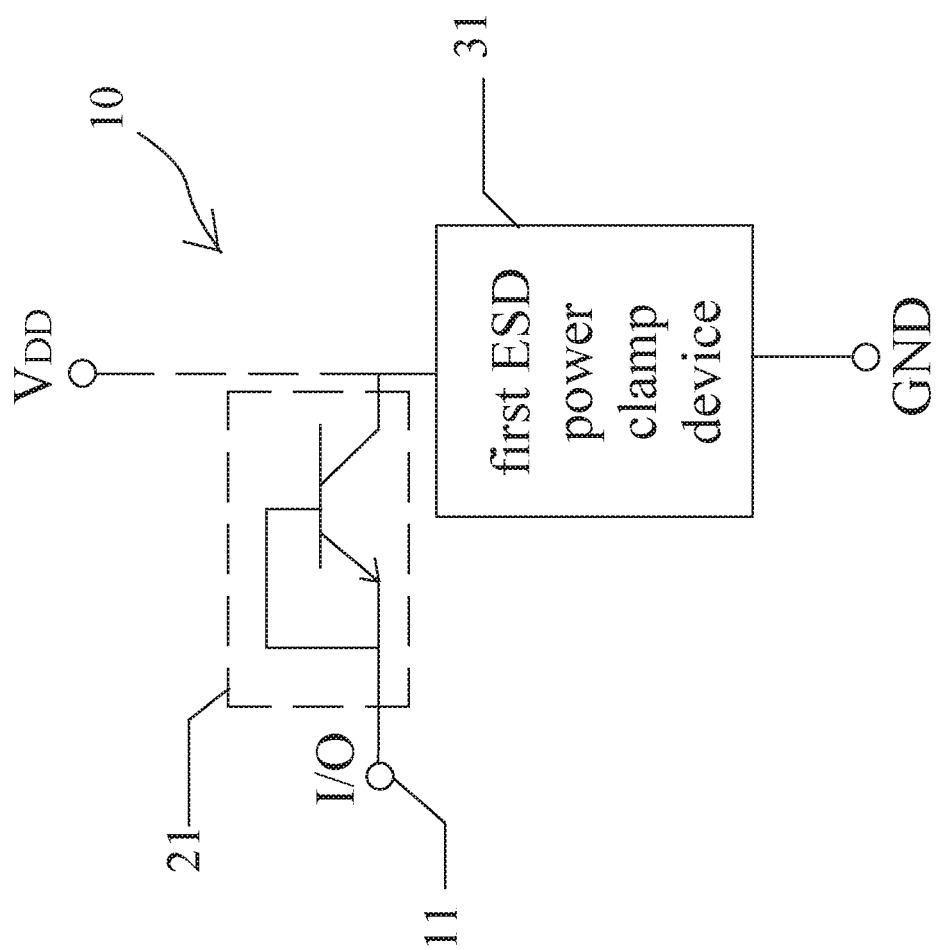
FIG. 3 shows a block diagram of an ESD protection circuit with low parasitic capacitance in accordance with the first embodiment of the present invention.

The present invention discloses an Electrostatic Discharge (ESD) protection circuit with low parasitic capacitance. Please refer to FIG. 3 for a first embodiment of the present invention, which shows a block diagram of an ESD protection circuit with low parasitic capacitance in accordance with the first embodiment of the present invention. As shown in FIG. 3, the ESD protection circuit 10 is electrically connected between an I/O terminal 11 and ground GND, comprising a first bipolar junction transistor (BJT) 21 and a first ESD power clamp device 31.

The first bipolar junction transistor 21 is an NPN type of bipolar junction transistor, having its base and emitter being commonly connected to the I/O terminal 11. A collector of the first bipolar junction transistor 21 is electrically connected to the first ESD power clamp device 31. And, the first ESD power clamp device 31 is connected between the collector of the first bipolar junction transistor 21 and ground GND. According to the embodiment of the present invention, the collector of the first bipolar junction transistor 21 can be electrically connected to a high voltage level $V_{DD}$. Alternatively, the collector of the first bipolar junction transistor 21 can be floating as well. As such, by employing the proposed scheme circuit diagram, when a positive ESD pulse or a negative ESD pulse is injected into the I/O terminal 11, an ESD protection path is provided successfully with low parasitic capacitance.

Figure 4:
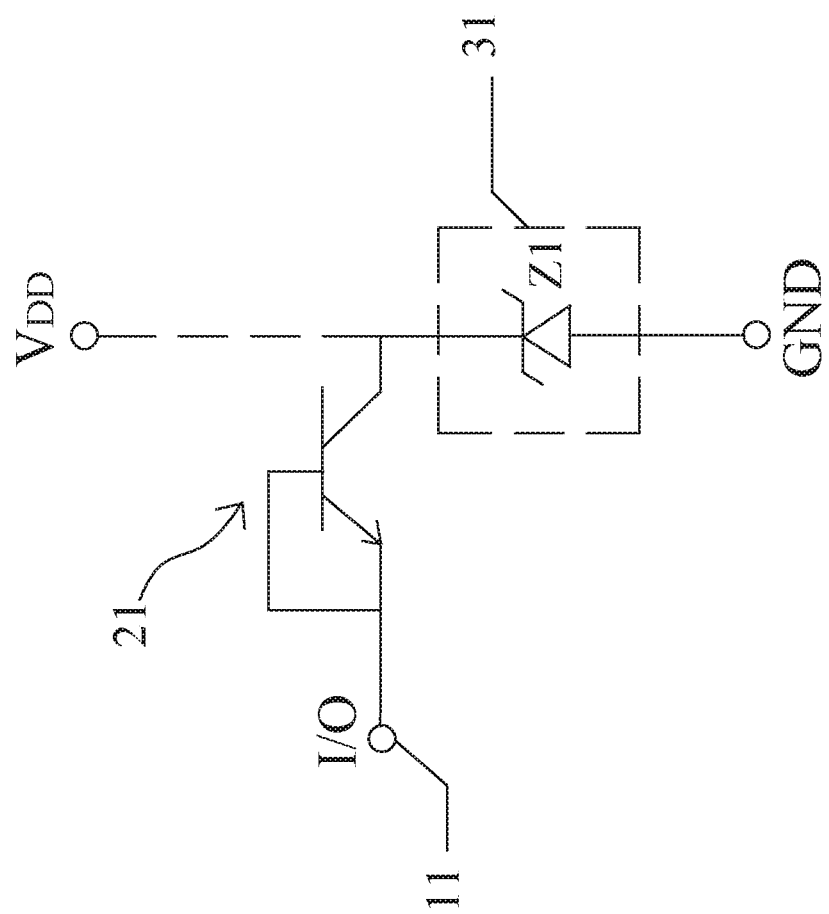
FIG. 4 shows a various embodiment for implementing the fabrication of the circuit diagram in FIG. 3, in which the first ESD power clamp device is implemented by using a Zener diode.
Figure 5:
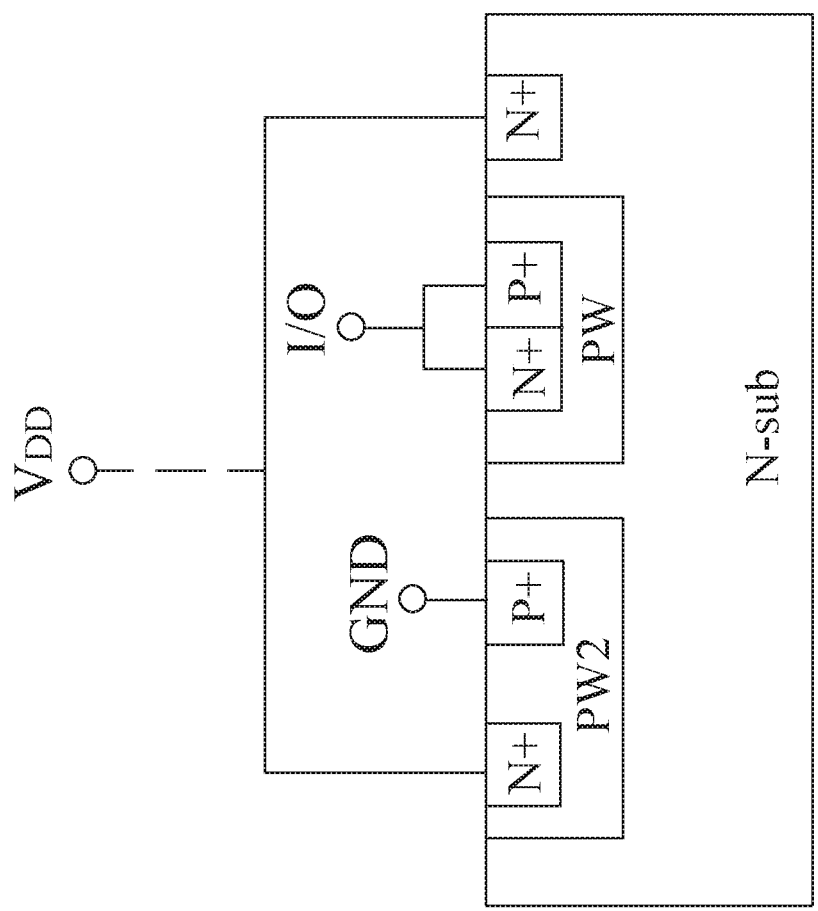
FIG. 5 shows a cross sectional view of the circuit diagram in FIG. 4 scheme.

FIG. 4 shows a various embodiment for implementing the fabrication of the circuit diagram in FIG. 3. As shown in FIG. 4, the first ESD power clamp device 31 can be implemented by using a Zener diode Z1. FIG. 5 shows a cross sectional view of the circuit diagram in FIG. 4 scheme, in which the ESD protection circuit with low parasitic capacitance is implemented through a semiconductor structure comprising an n type substrate N-sub, a first p type well PW, a second p type well PW2, a first n type heavily doped region N+, a first p type heavily doped region P+, a second n type heavily doped region N+, a second p type heavily doped region P+, and a third n type heavily doped region N+.

The first p type well PW is provided in the n type substrate N-sub, and the first n type heavily doped region N+ and the first p type heavily doped region P+ are disposed in the first p type well PW. The first n type heavily doped region N+ and the first p type heavily doped region P+ are commonly connected to the I/O terminal. The second p type well PW2 is also provided in the n type substrate N-sub, and the second n type heavily doped region N+ and the second p type heavily doped region P+ are disposed in the second p type well PW2. The second p type heavily doped region P+ in the second p type well PW2 is connected to ground GND. A third n type heavily doped region N+ is directly formed in the n type substrate N-sub, and is electrically connected to the second n type heavily doped region N+ in the second p type well PW2. The third n type heavily doped region N+ in the n type substrate N-sub and the second n type heavily doped region N+ in the second p type well PW2 are commonly connected to the high voltage level $V_{DD}$ or floating.

Figure 6:
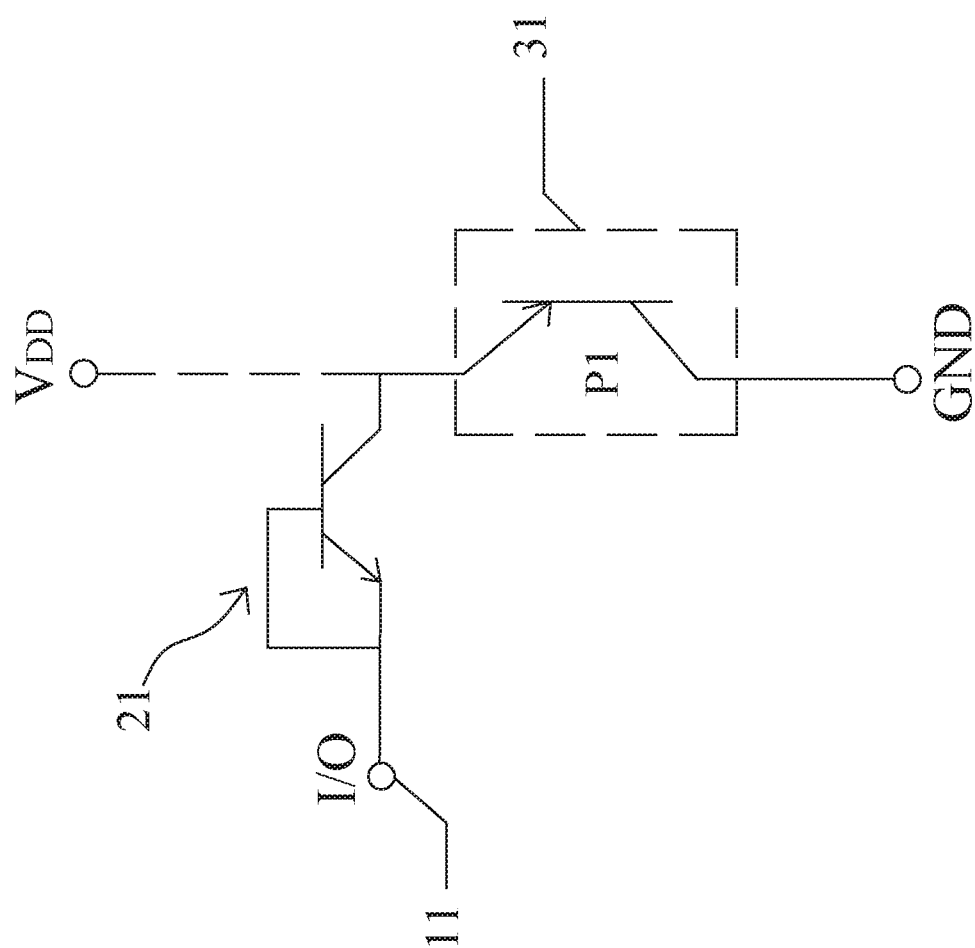
FIG. 6 shows another various embodiment for implementing the fabrication of the circuit diagram in FIG. 3, in which the first ESD power clamp device is implemented by using a PNP type of bipolar junction transistor.

FIG. 6 shows another various embodiment for implementing the fabrication of the circuit diagram in FIG. 3. As shown in FIG. 6, the first ESD power clamp device 31 can be implemented by using a PNP type of bipolar junction transistor P1. The collector of the first bipolar junction transistor 21 is electrically connected to an emitter of the PNP type of bipolar junction transistor P1, and a collector of the PNP type of bipolar junction transistor P1 is electrically connected to ground GND.

Figure 7:
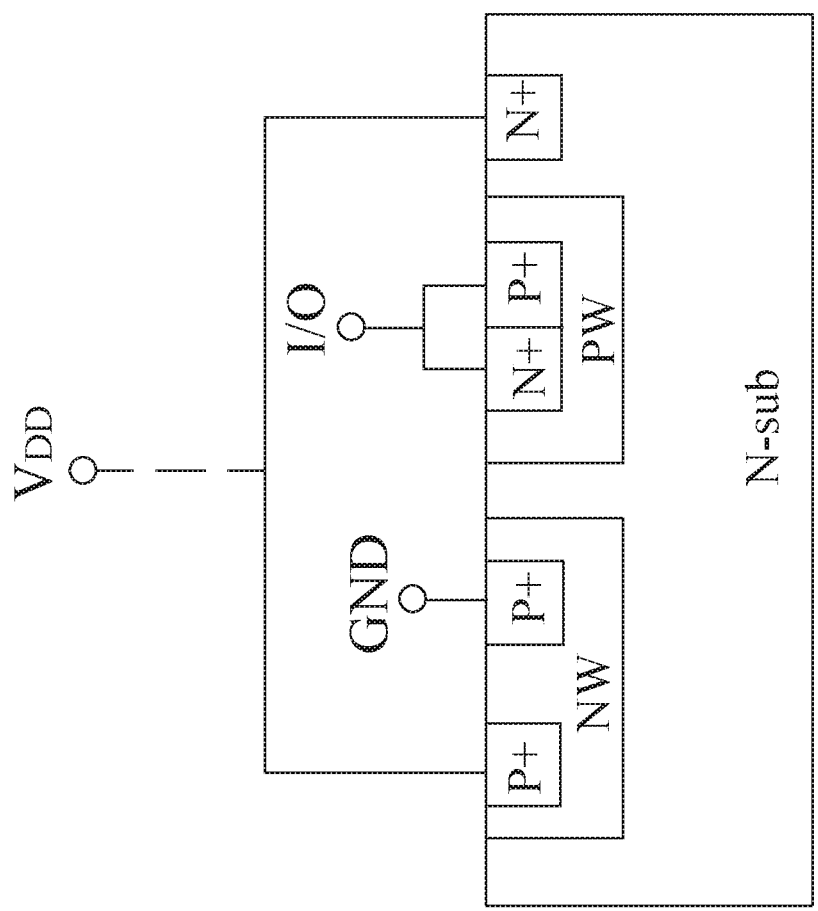
FIG. 7 shows a cross sectional view of the circuit diagram in FIG. 6 scheme.

FIG. 7 shows a cross sectional view of the circuit diagram in FIG. 6 scheme, in which the ESD protection circuit with low parasitic capacitance is implemented through a semiconductor structure comprising an n type substrate N-sub, a first p type well PW, a first n type well NW, a first n type heavily doped region N+, a first p type heavily doped region P+, a second p type heavily doped region P+, a third p type heavily doped region P+, and a second n type heavily doped region N+.

The first p type well PW is provided in the n type substrate N-sub, and the first n type heavily doped region N+ and the first p type heavily doped region P+ are disposed in the first p type well PW. The first n type heavily doped region N+ and the first p type heavily doped region P+ are commonly connected to the I/O terminal. The first n type well NW is also provided in the n type substrate N-sub, and the second p type heavily doped region P+ formed in the first n type well NW is connected to ground GND. The third p type heavily doped region P+ formed in the first n type well NW is connected to the second n type heavily doped region N+, which is directly formed in the n type substrate N-sub. The second n type heavily doped region N+ in the n type substrate N-sub and the third p type heavily doped region P+ in the first n type well NW are commonly connected to the high voltage level $V_{DD}$ or floating.

Figure 8:
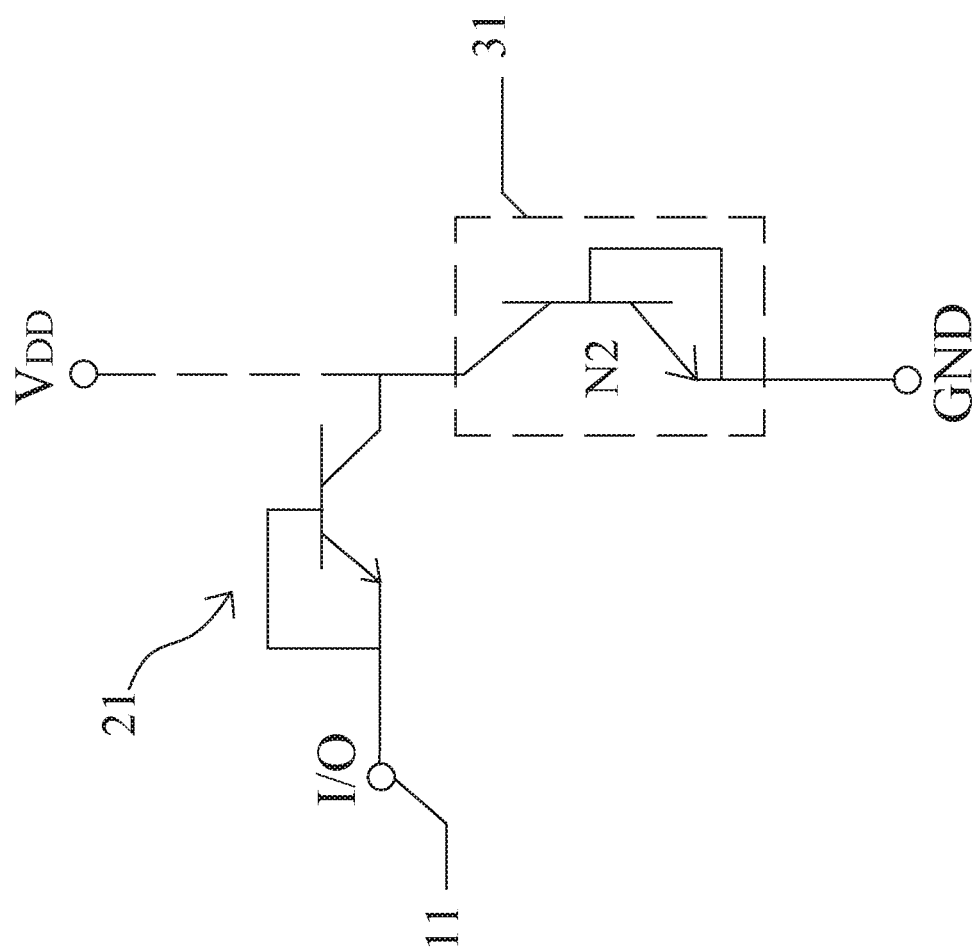
FIG. 8 shows yet another various embodiment for implementing the fabrication of the circuit diagram in FIG. 3, in which the first ESD power clamp device is implemented by using an NPN type of bipolar junction transistor.

FIG. 8 shows yet another various embodiment for implementing the fabrication of the circuit diagram in FIG. 3. As shown in FIG. 8, the first ESD power clamp device 31 can be implemented by using a second bipolar junction transistor N2 as an NPN type of bipolar junction transistor. As illustrated in FIG. 8, the collector of the first bipolar junction transistor 21 is electrically connected to a collector of the second bipolar junction transistor N2, and a base and an emitter of the second bipolar junction transistor N2 are commonly connected to ground GND.

Figure 9:
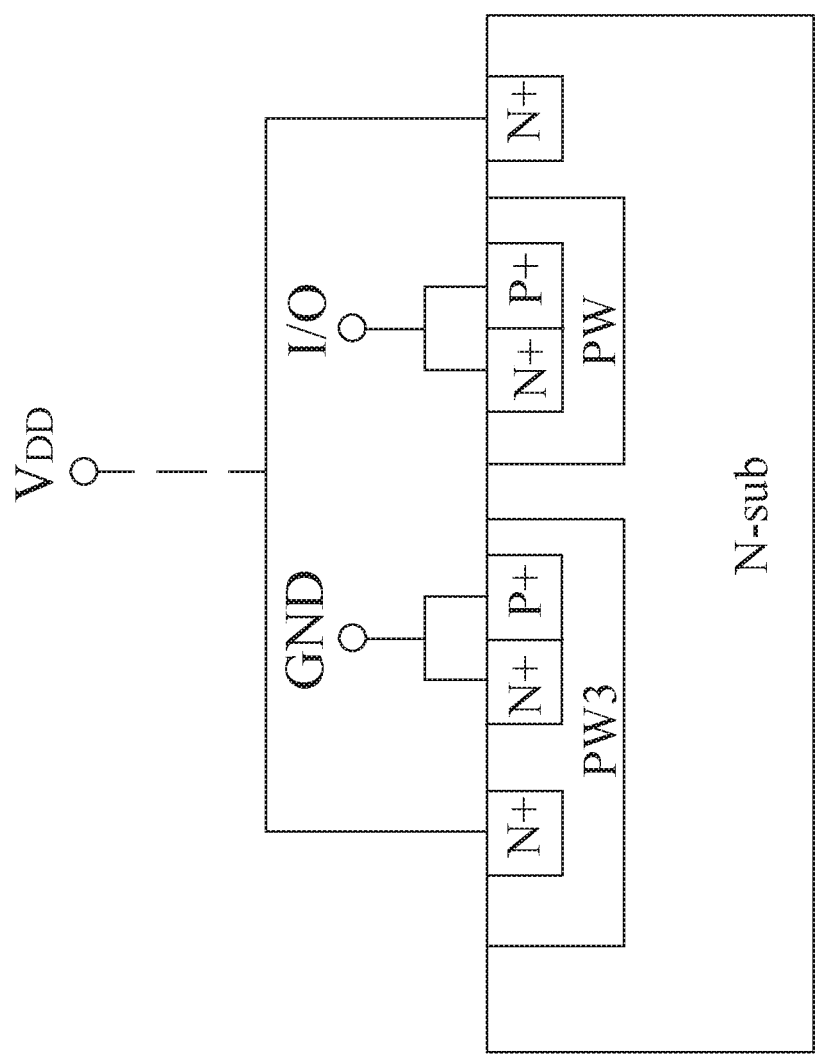
FIG. 9 shows a cross sectional view of the circuit diagram in FIG. 8 scheme.

FIG. 9 shows a cross sectional view of the circuit diagram in FIG. 8 scheme, in which the ESD protection circuit with low parasitic capacitance is implemented through a semiconductor structure comprising an n type substrate N-sub, a first p type well PW, a third p type well PW3, a first n type heavily doped region N+, a first p type heavily doped region P+, a second n type heavily doped region N+, a second p type heavily doped region P+, a third n type heavily doped region N+ and a fourth n type heavily doped region N+.

The first p type well PW is provided in the n type substrate N-sub, and the first n type heavily doped region N+ and the first p type heavily doped region P+ are disposed in the first p type well PW. The first n type heavily doped region N+ and the first p type heavily doped region P+ are commonly connected to the I/O terminal. The third p type well PW3 is also provided in the n type substrate N-sub, and the second p type heavily doped region P+ and the second n type heavily doped region N+ are formed in the third p type well PW3. The second p type heavily doped region P+ and the second n type heavily doped region N+ formed in the third p type well PW3 are commonly connected to ground GND. The third n type heavily doped region N+ formed in the third p type well PW3 is connected to the fourth n type heavily doped region N+, which is directly formed in the n type substrate N-sub. The fourth n type heavily doped region N+ in the n type substrate N-sub and the third n type heavily doped region N+ in the third p type well PW3 are commonly connected to the high voltage level $V_{DD}$ or floating.

To sum above, it is apparent that the first ESD power clamp device 31 can be implemented by using a Zener diode, a PNP type of bipolar junction transistor, an NPN type of bipolar junction transistor, and so on. However, the present invention is not limited thereto. For people who are skilled in the art, modifications and variations are allowed to be made to the present invention without departing the spirits of the present invention, and yet still fall into the scope of the present invention.

Hereinafter, the Applicant provides detailed descriptions in the following paragraph to explain how the present invention is aimed for providing a successful ESD protection path with low parasitic capacitance under a situation of injecting a positive ESD impulse and a negative ESD impulse, respectively.

Figure 10A:
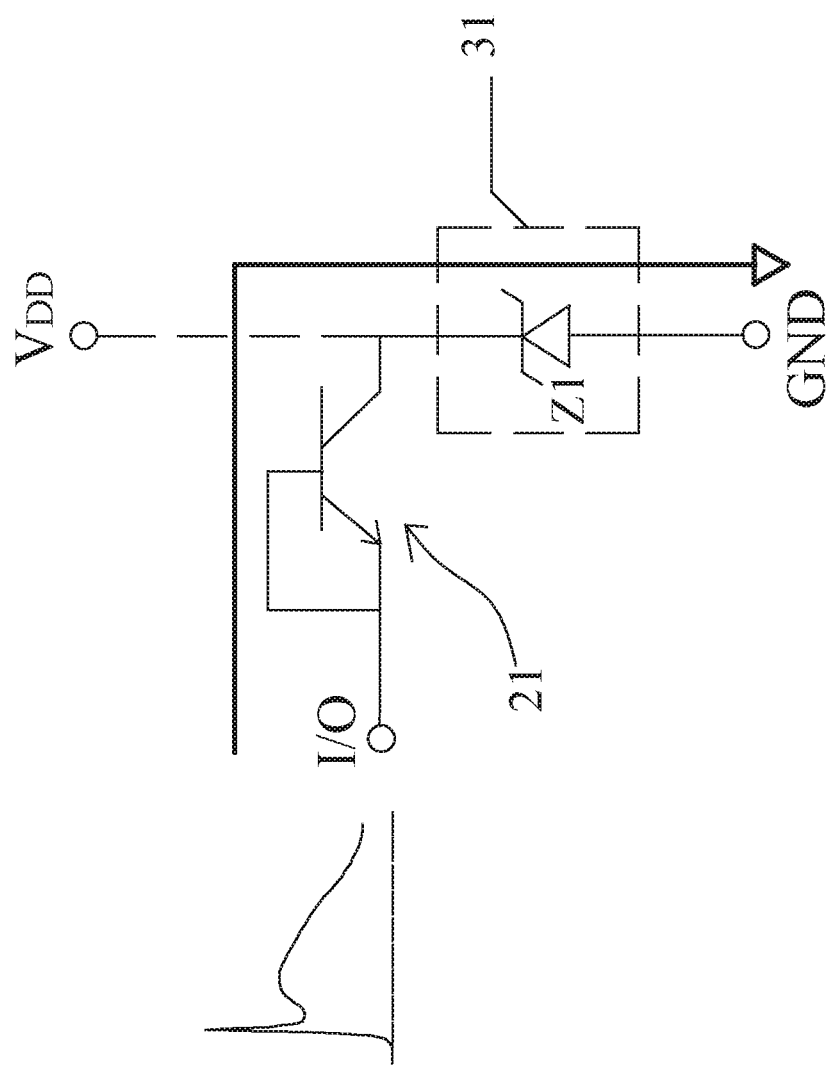
FIG. 10A and FIG. 10B illustrate current flow directions in FIG. 4 when a positive ESD impulse is injected into the I/O terminal.
Figure 10B:
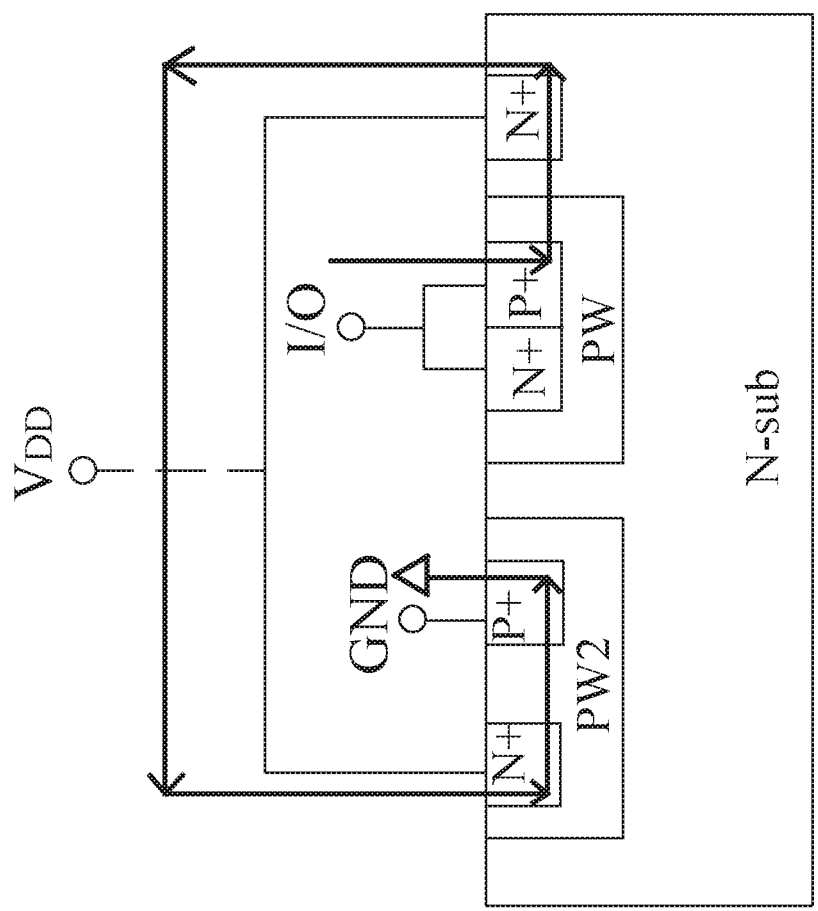

Please refer to FIG. 10A and FIG. 10B first. An explanatory example is made with referring to the embodiment in FIG. 4, when a positive ESD impulse is injected into the I/O terminal, and the first ESD power clamp device is implemented by using the Zener diode Z1. As can be seen, when the positive ESD impulse is injected, the current flow direction is illustrated by the arrow in FIG. 10A and FIG. 10B. Under such circumstance when a positive ESD impulse is injected, the ESD protection path is formed consisting of the first bipolar junction transistor 21 and the first ESD power clamp device, i.e. the Zener diode Z1.

Figure 11A:
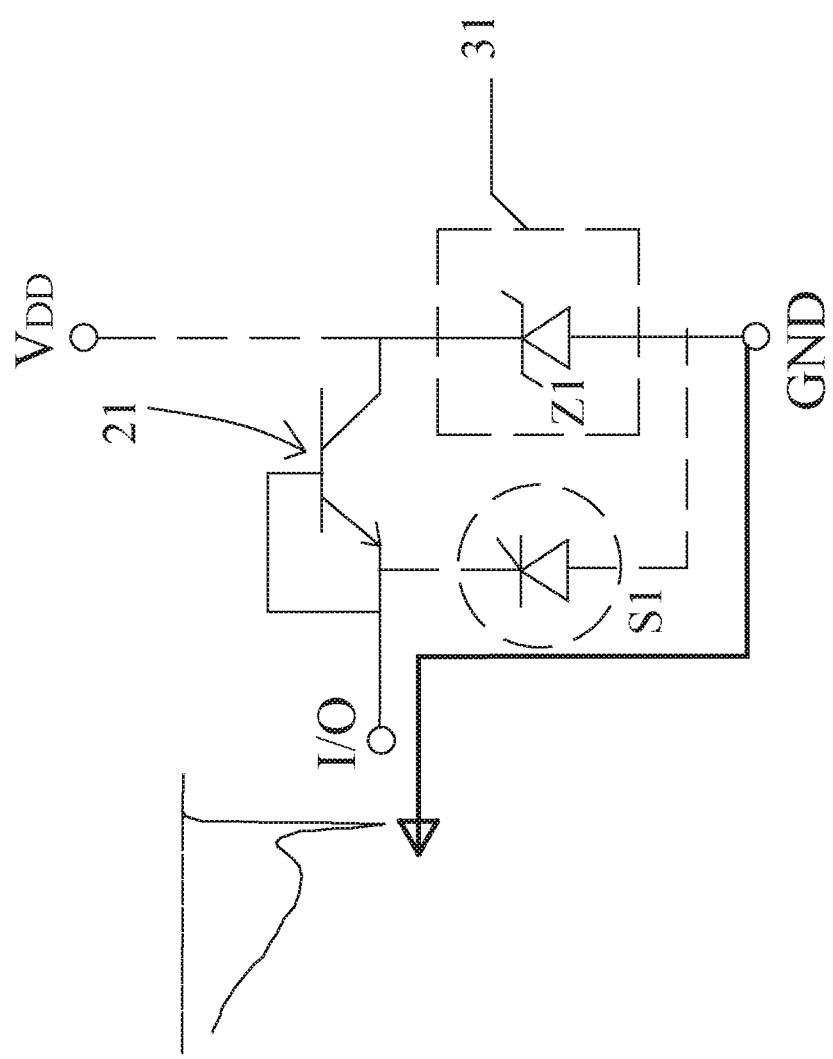
FIG. 11A and FIG. 11B illustrate current flow directions in FIG. 4 when a negative ESD impulse is injected into the I/O terminal.
Figure 11B:
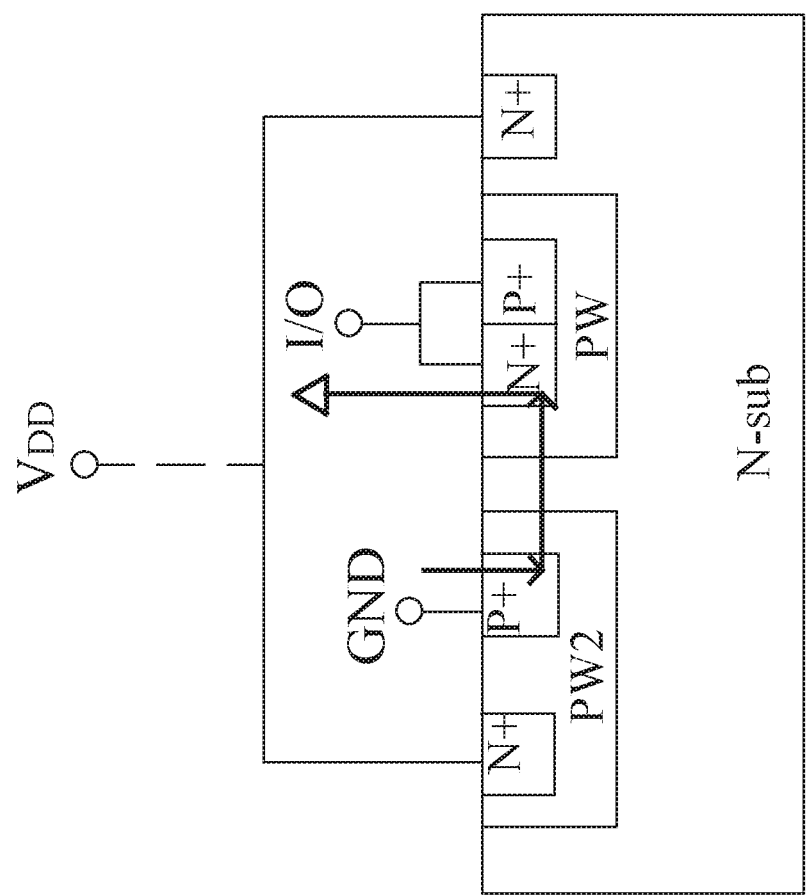

In another aspect, FIG. 11A and FIG. 11B show the embodiment when a negative ESD impulse is injected into the I/O terminal. The current flow direction is illustrated by the arrow as well. It draws our attention that in FIG. 11B, the current flow begins with ground GND, then to the p type heavily doped region P+, the p type well PW2, the n type substrate N-sub, the p type well PW, the n type heavily doped region N+ and finally to the I/O terminal. The series of PW2/N-sub/PW/N+ acts as a parasitic silicon controlled rectifier (SCR). As a result, with referring to FIG. 11A, it is believed that when the negative ESD pulse is injected into the I/O terminal, the ESD protection path will be formed consisting of such parasitic silicon controlled rectifier (SCR) Si, as indicated by the dashed lines.

Figure 2:
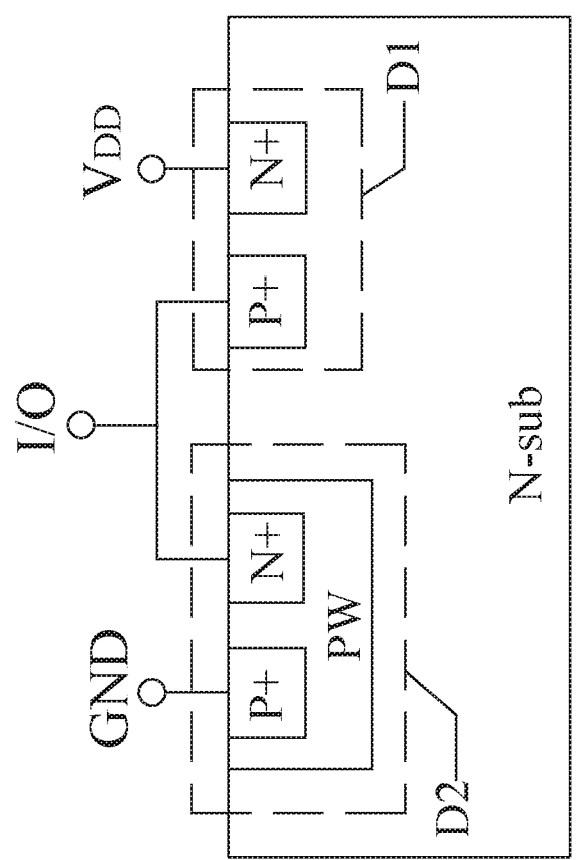
FIG. 2 shows a cross sectional view of the conventional ESD protector in FIG. 1B scheme.

Subsequently, FIG. 11B and FIG. 2 are taken as examples for comparison to prove that the present invention is effective in reducing the parasitic capacitance. As discussed earlier, the junction capacitance of the conventional ESD architecture using the steering diode, comprising the first diode D1 and the second diode D2, will be equal to the capacitance of (D1+D2), which are the capacitance of both the junction from P+ to N-sub and the junction from N+ to PW.

However, regarding the scheme proposed by the present invention in FIG. 11B, it is apparent that the parasitic capacitance of the present invention is merely the capacitance of the junction from PW to N-sub. On account of the above, it is believed that the parasitic capacitance of the present invention is obviously less than that of the traditional circuit design, and is able to achieve the same level of ESD protection effect as the traditional one.

Figure 12:
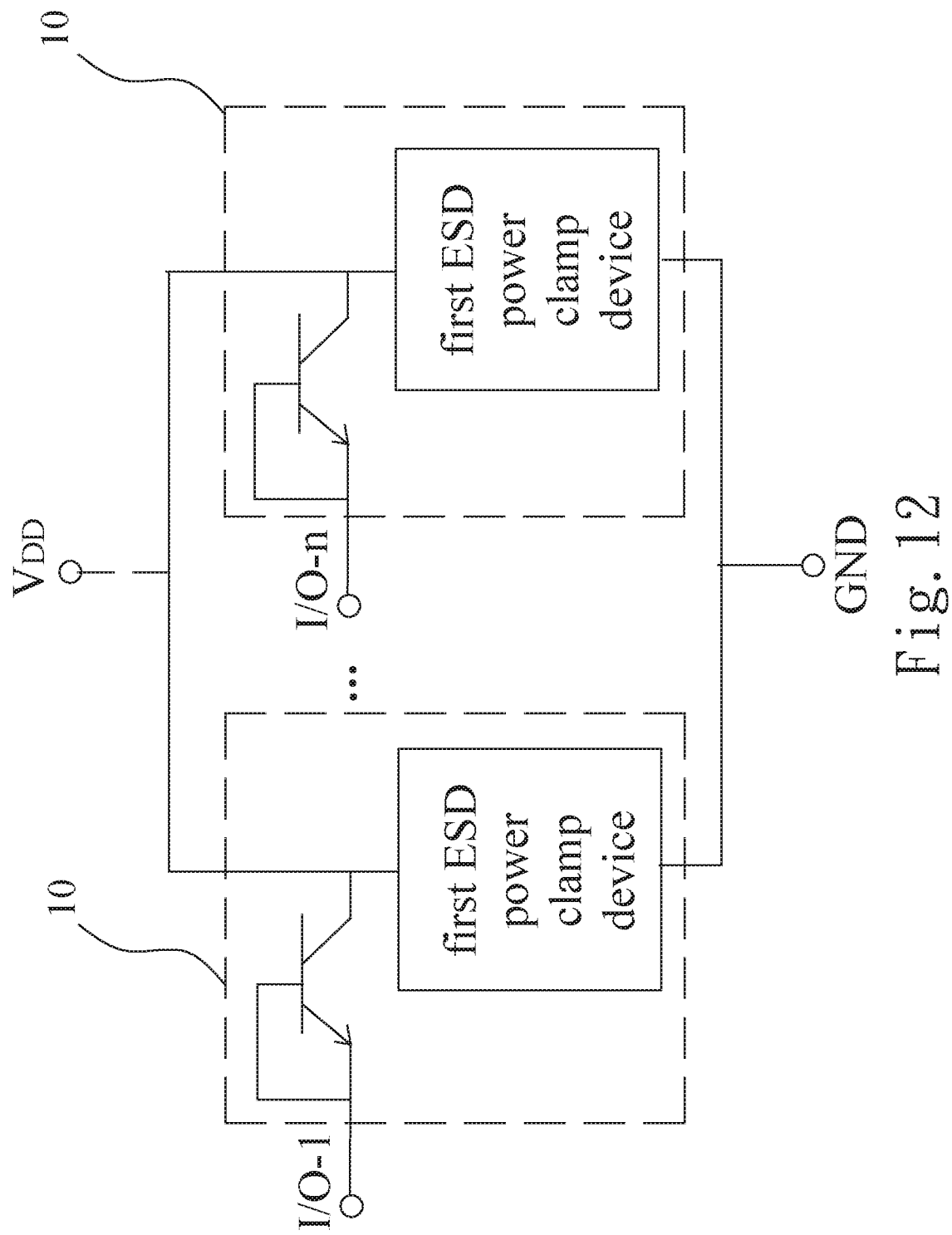
FIG. 12 shows a circuit diagram of the ESD protection circuit with low parasitic capacitance in accordance with the embodiment of the present invention when using a multi-channel design.
Figure 13:
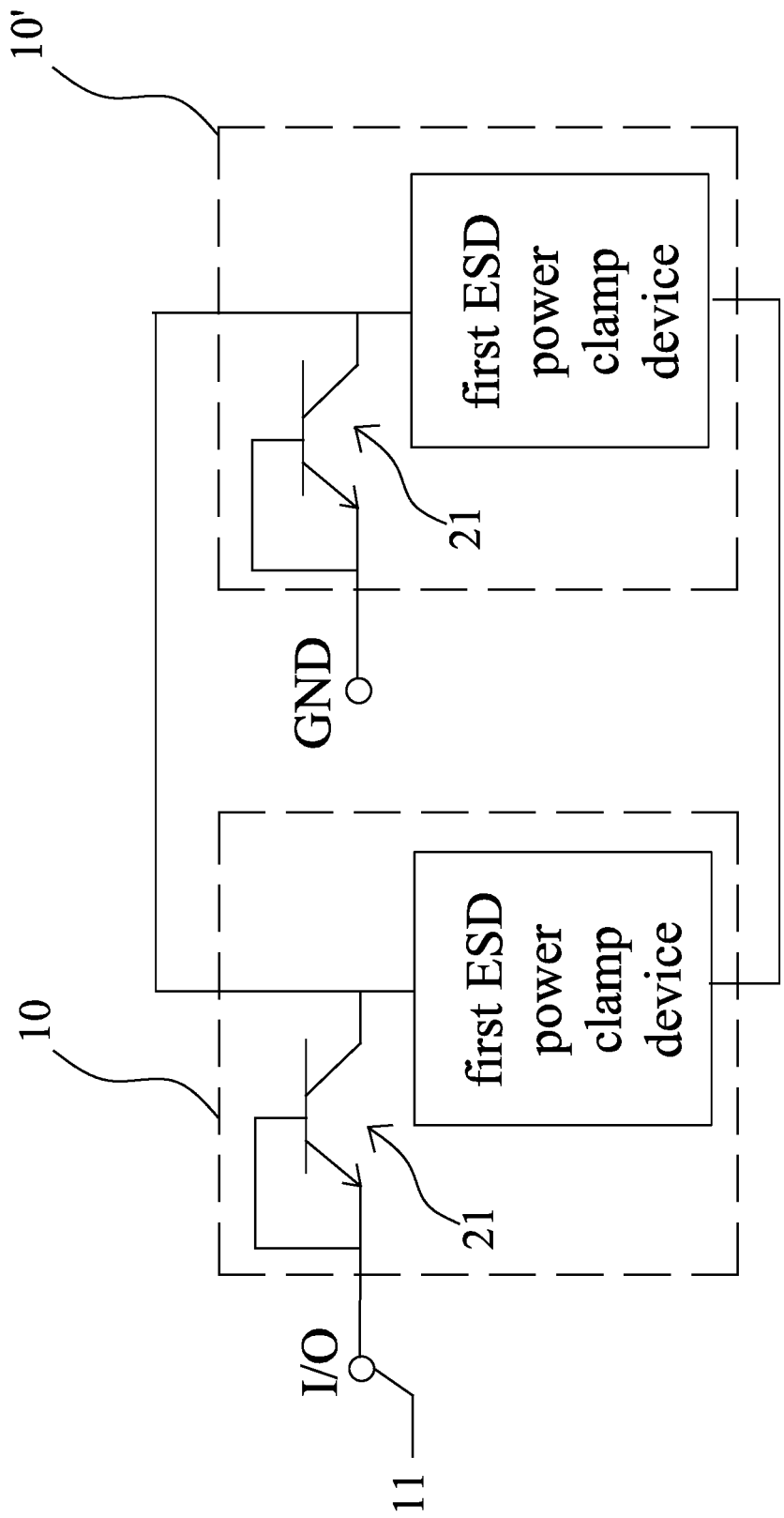
FIG. 13 shows a circuit diagram of the ESD protection circuit with low parasitic capacitance in accordance with the embodiment of the present invention when using a bi-directional design.

Moreover, FIG. 12 and FIG. 13 show some more variations based on the spirit of the invention. Please refer to FIG. 12, which shows a circuit diagram of the ESD protection circuit with low parasitic capacitance in accordance with the embodiment of the present invention when using a multi-channel design. In FIG. 12, it discloses a plurality of I/O terminals, I/O-1, . . . I/O-n, and each of the I/O terminals, I/O-1, . . . I/O-n is electrically connected with an ESD protection circuit 10. FIG. 13 shows a circuit diagram of the ESD protection circuit with low parasitic capacitance in accordance with the embodiment of the present invention when using a bi-directional design. In FIG. 13, an Electrostatic discharge (ESD) protection structure with low parasitic capacitance is provided. The ESD protection structure with low parasitic capacitance is connected between an I/O terminal 11 and ground GND, and comprises a first ESD protection circuit 10 and a second ESD protection circuit 10'.

The first ESD protection circuit 10 comprises a first bipolar junction transistor (BJT) 21 and a first ESD power clamp device, as described in the previous embodiment in FIG. 3. The first bipolar junction transistor 21 is an NPN type of bipolar junction transistor, including a base and an emitter of the first bipolar junction transistor 21 being commonly connected to the I/O terminal 11. The first ESD power clamp device is connected to a collector of the first bipolar junction transistor 21.

The second ESD protection circuit 10' also comprises the first bipolar junction transistor (BJT) 21 and the first ESD power clamp device. The first bipolar junction transistor 21 is an NPN type of bipolar junction transistor, including a base and an emitter of such first bipolar junction transistor 21 of the second ESD protection circuit 10' being commonly connected to the ground GND. The first ESD power clamp device of the second ESD protection circuit 10' is connected to a collector of the first bipolar junction transistor 21 of the second ESD protection circuit 10'. The first ESD power clamp device of the first ESD protection circuit 10 is connected to the first ESD power clamp device of the second ESD protection circuit 10', and the collector of the first bipolar junction transistor 21 of the first ESD protection circuit 10 is connected to the collector of the first bipolar junction transistor 21 of the second ESD protection circuit 10', so as to form a bi-directional design.

From these two schemes, it is proven that the present invention is able to be applicable to not only a bi-directional design, as shown in FIG. 13, but also able to a multi-channel design, comprising a plurality of I/O terminals, I/O-1, . . . I/O-n as shown in FIG. 12.

Figure 14:
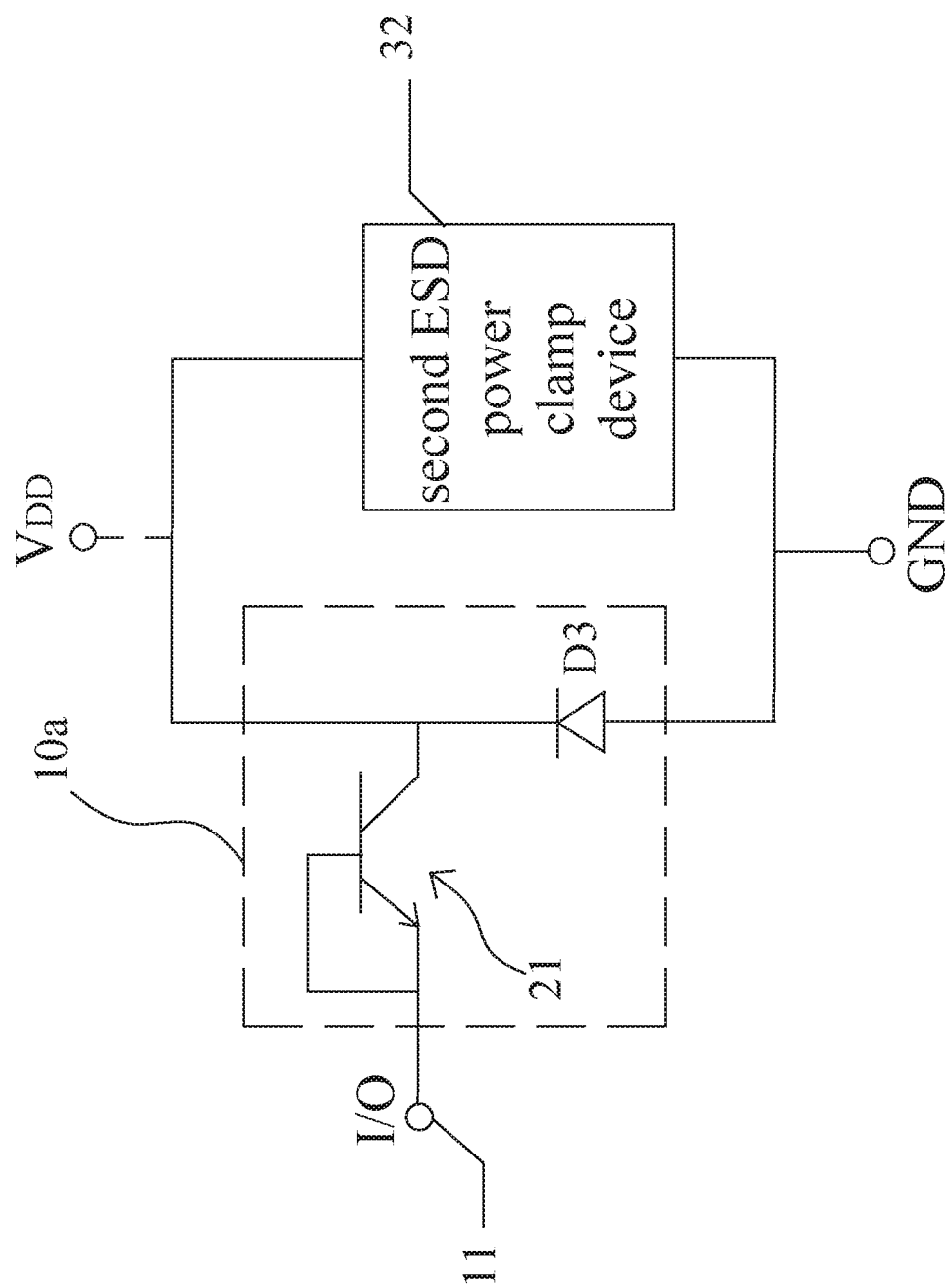
FIG. 14 shows a block diagram of an ESD protection circuit with low parasitic capacitance in accordance with another embodiment of the present invention, in which the first ESD power clamp device is replaced by a diode element.

In another aspect, FIG. 14 shows another embodiment of the present invention, which illustrates a block diagram of the ESD protection circuit with low parasitic capacitance in accordance with the present invention, when the first ESD power clamp device 31 is replaced by a diode element D3. An anode of the diode element D3 is electrically connected to ground GND, and a cathode of the diode element D3 is electrically connected to the collector of the first bipolar junction transistor 21.

According to such embodiment, the proposed ESD protection circuit 10a connecting between the I/O terminal 11 and ground GND, comprises the first bipolar junction transistor (BJT) 21 and the diode element D3. Since the breakdown voltage of the diode element D3 is inevitably high, a second ESD power clamp device 32, connecting between the high voltage level $V_{DD}$ and ground GND, is furthered connected in parallel with the diode element D3 so as to provide a new ESD protection path when the positive ESD pulse is injected. According to the embodiment of the present invention, the second ESD power clamp device 32 can be alternatively a Zener diode, an NPN type of bipolar junction transistor, or a PNP type of bipolar junction transistor.

Figure 15A:
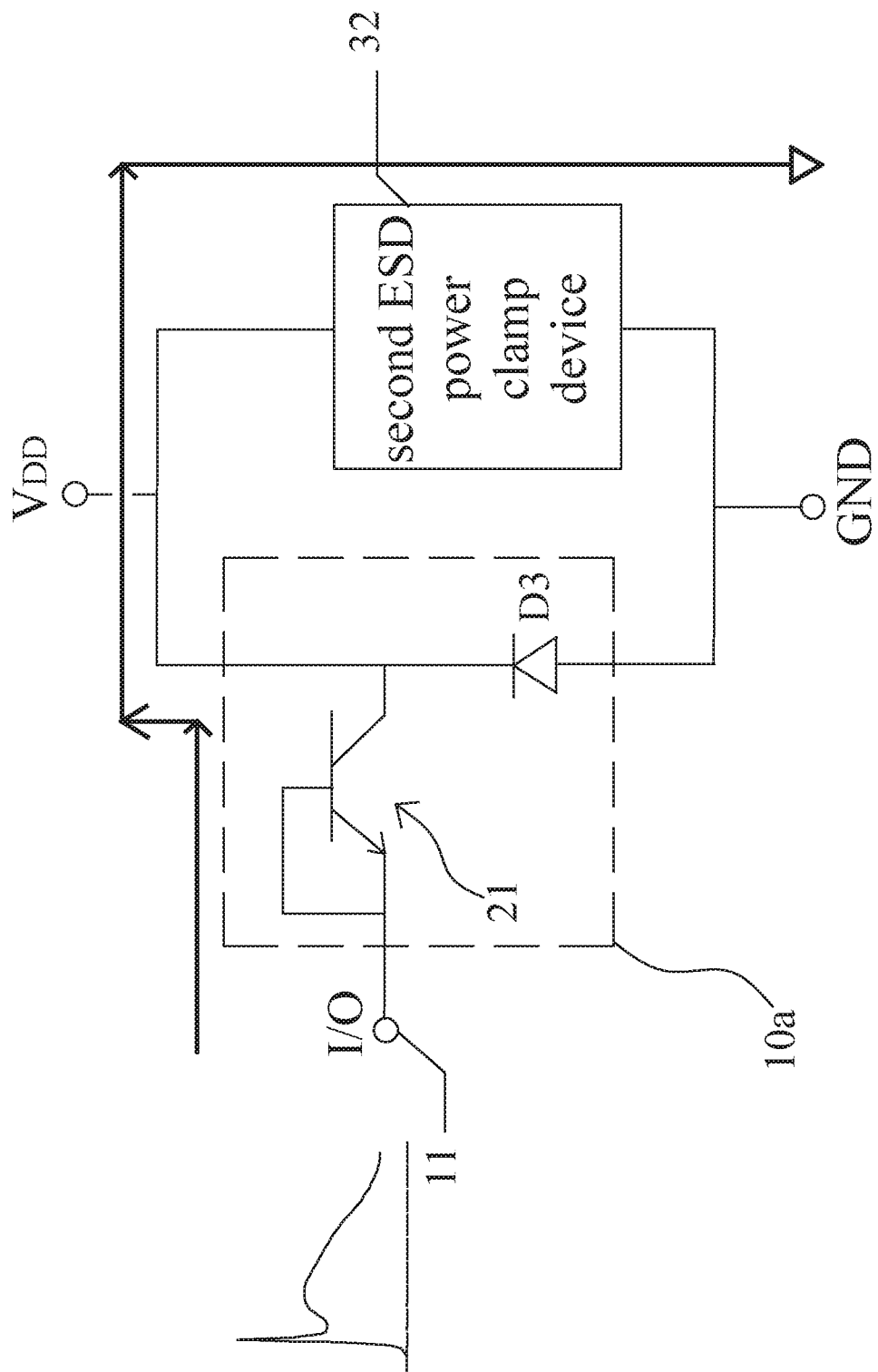
FIG. 15A and FIG. 15B illustrate current flow directions in FIG. 14 when a positive ESD impulse is injected into the I/O terminal.
Figure 15B:
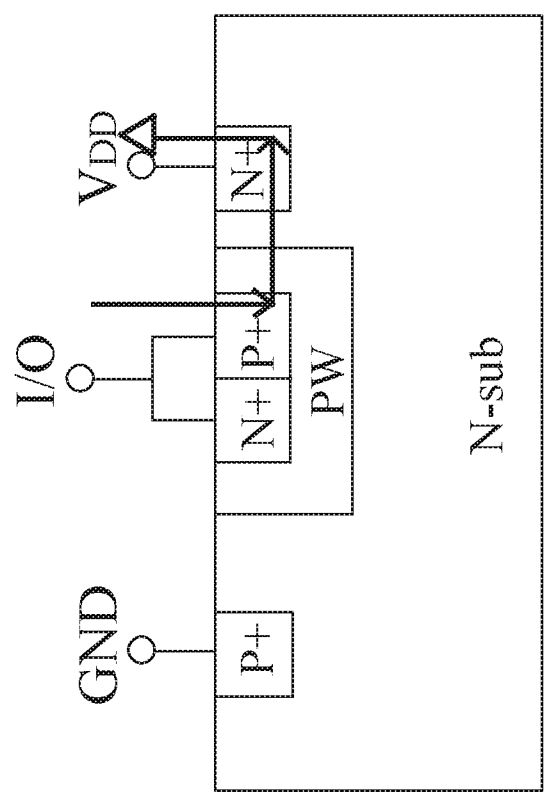

FIG. 15A shows the embodiment when a positive ESD impulse is injected into the I/O terminal. FIG. 15B shows a cross sectional view of the embodiment in accordance with FIG. 15A when a positive ESD impulse is injected into the I/O terminal. The current flow direction is illustrated by the arrow. It is apparent that, when the positive ESD impulse is injected, the new ESD protection path is formed consisting of the first bipolar junction transistor 21 and the second ESD power clamp device 32.

Figure 16A:
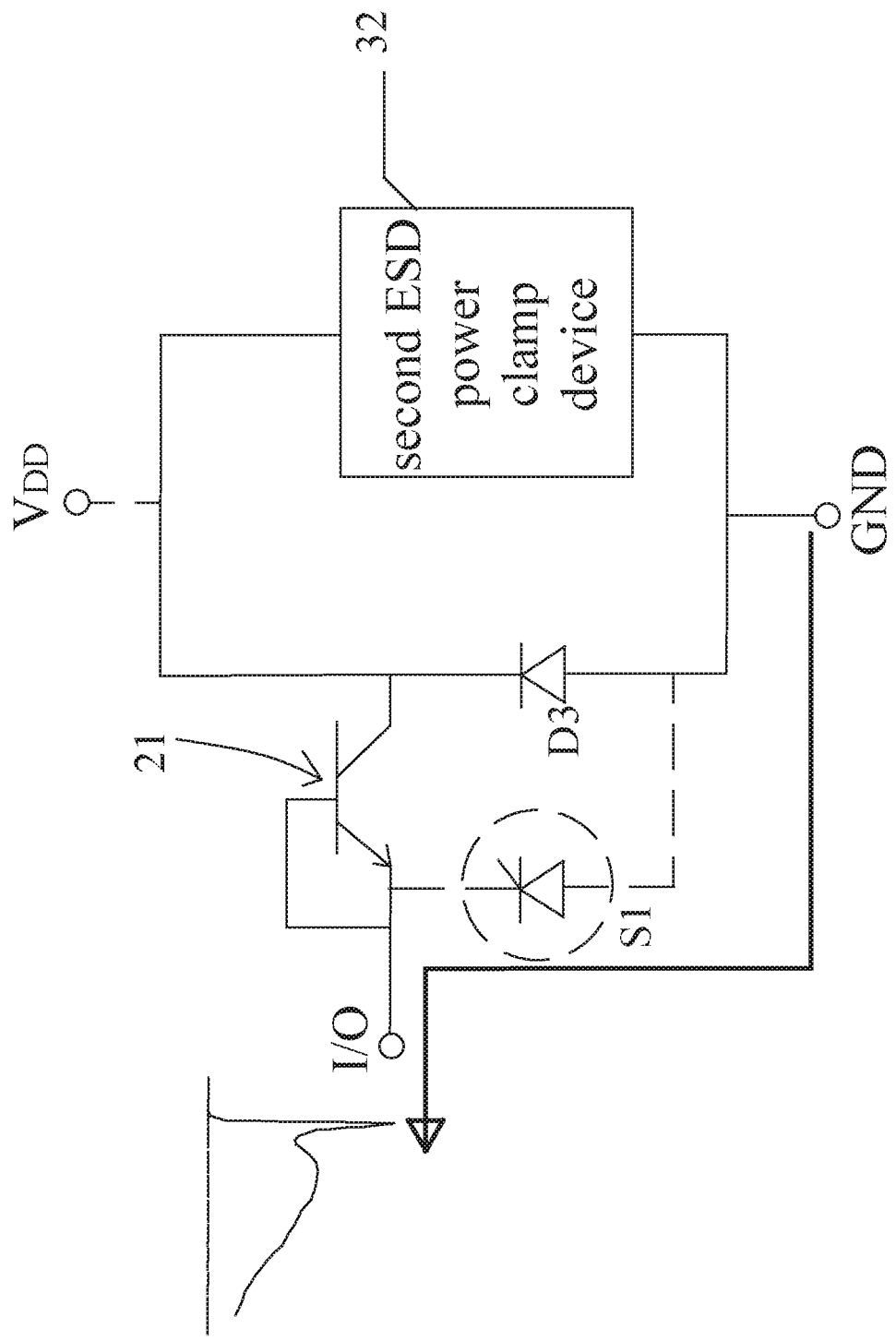
FIG. 16A and FIG. 16B illustrate current flow directions in FIG. 14 when a negative ESD impulse is injected into the I/O terminal.
Figure 16B:
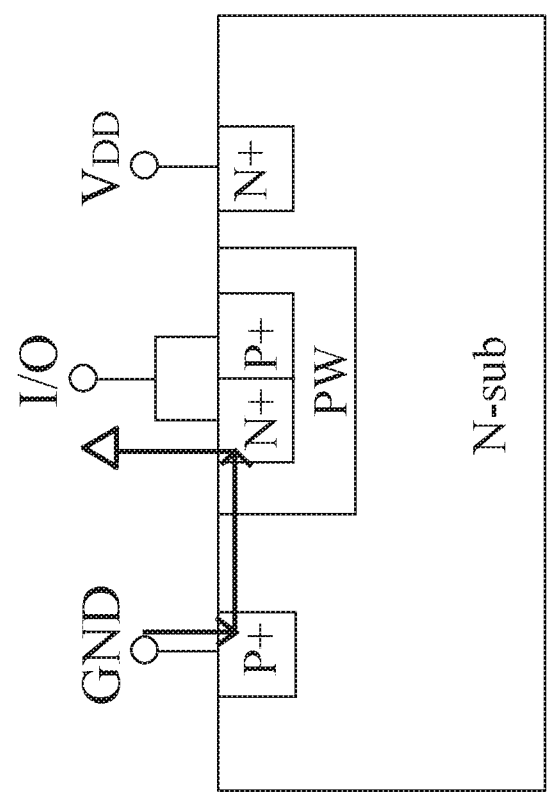

Similarly, FIG. 16A shows the embodiment when a negative ESD impulse is injected into the I/O terminal. FIG. 16B shows a cross sectional view of the embodiment in accordance with FIG. 16A when a negative ESD impulse is injected into the I/O terminal. The current flow direction is illustrated by the arrow as well. It draws our attention that in FIG. 16B, the current flow begins with ground GND, then to the p type heavily doped region P+, the n type substrate N-sub, the p type well PW, the n type heavily doped region N+, and finally to the I/O terminal. The series of P+/N-sub/PW/N+ acts as a parasitic silicon controlled rectifier (SCR). As a result, with referring to FIG. 16A, it is believed that when the negative ESD pulse is injected into the I/O terminal, the new ESD protection path will be formed consisting of such parasitic silicon controlled rectifier (SCR) 51, as indicated by the dashed lines.

Furthermore, regarding FIG. 16B, it is apparent that the parasitic capacitance of the present invention is merely the capacitance of the junction from PW to N-sub as well. Compared with the conventional circuit diagram in FIG. 2, in which its parasitic capacitance (D1+D2) are the capacitance of both the junction from P+ to N-sub and the junction from N+ to PW, it is believed that the parasitic capacitance of the present invention is greatly reduced, and the novel ESD protection circuit with low parasitic capacitance is achieved.

Figure 17:
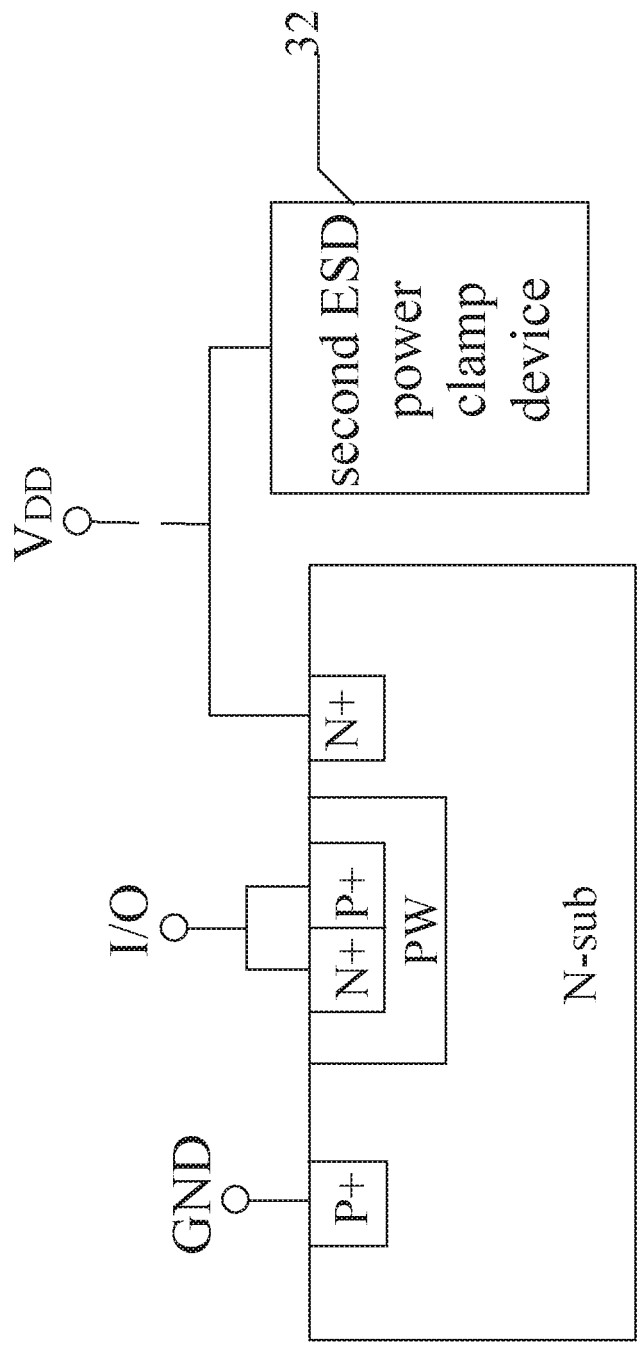
FIG. 17 shows one embodiment for implementing the fabrication of the circuit diagram of FIG. 14 in a horizontal device.

FIG. 17 shows one embodiment for implementing the fabrication of the circuit diagram of FIG. 14 in a horizontal device. The ESD protection circuit with low parasitic capacitance of FIG. 14 in a horizontal device is implemented through a semiconductor structure comprising an n type substrate N-sub, a p type well PW, a first n type heavily doped region N+, a first p type heavily doped region P+, a second n type heavily doped region N+, and a second p type heavily doped region P+.

The p type well PW is provided in the n type substrate N-sub, and a first n type heavily doped region N+ and a first p type heavily doped region P+ are disposed in the p type well PW. The first n type heavily doped region N+ and the first p type heavily doped region P+ are commonly connected to the I/O terminal. The second p type heavily doped region P+ disposed in the n type substrate N-sub is connected to ground GND. The second n type heavily doped region N+ formed directly in the n type substrate N-sub is connected to the second ESD power clamp device 32. The second n type heavily doped region N+ formed in the n type substrate N-sub and the second ESD power clamp device 32 are commonly connected to the high voltage level $V_{DD}$ or floating.

Figure 18:
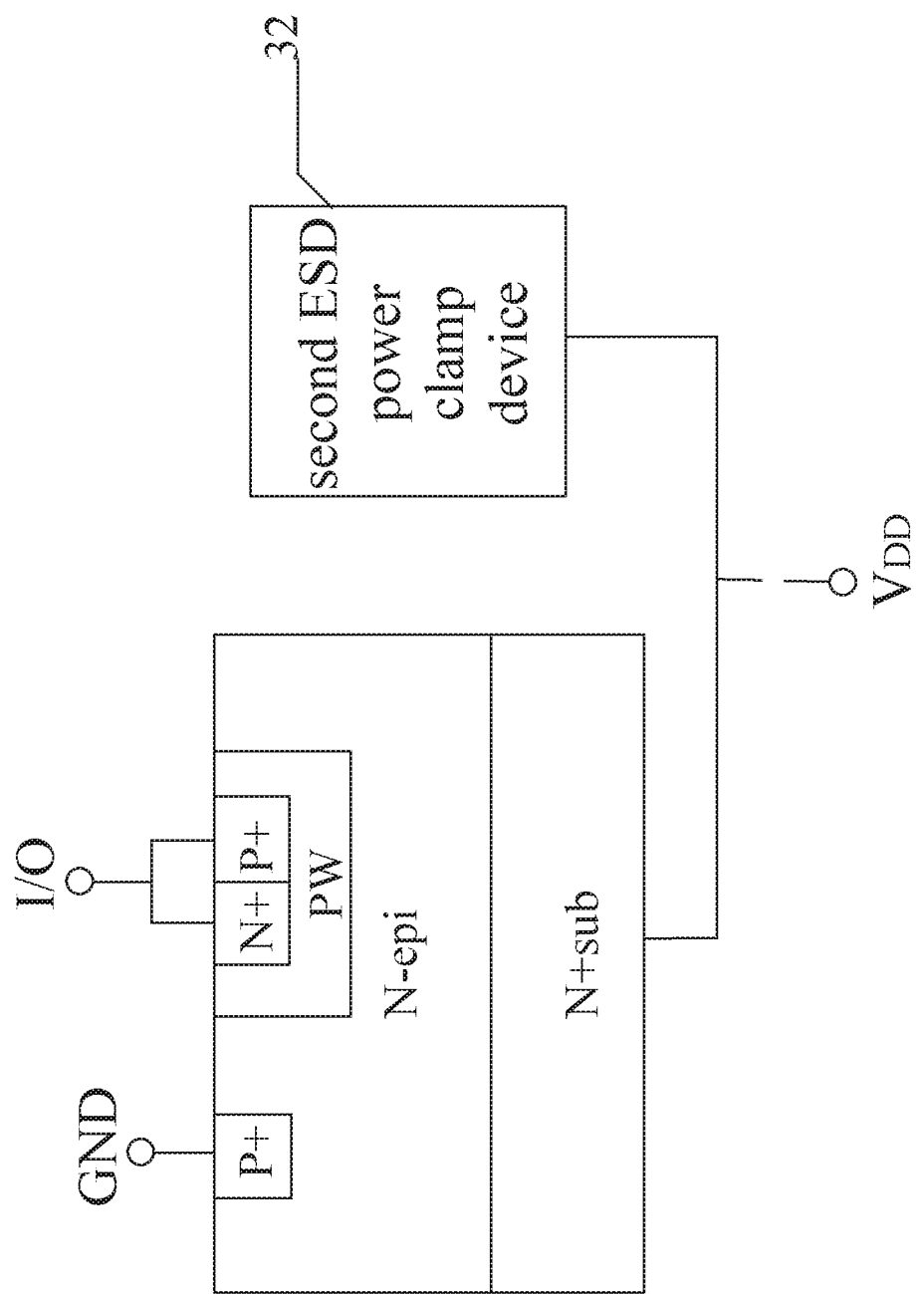
FIG. 18 shows one embodiment for implementing the fabrication of the circuit diagram of FIG. 14 in a vertical device.
Figure 19:
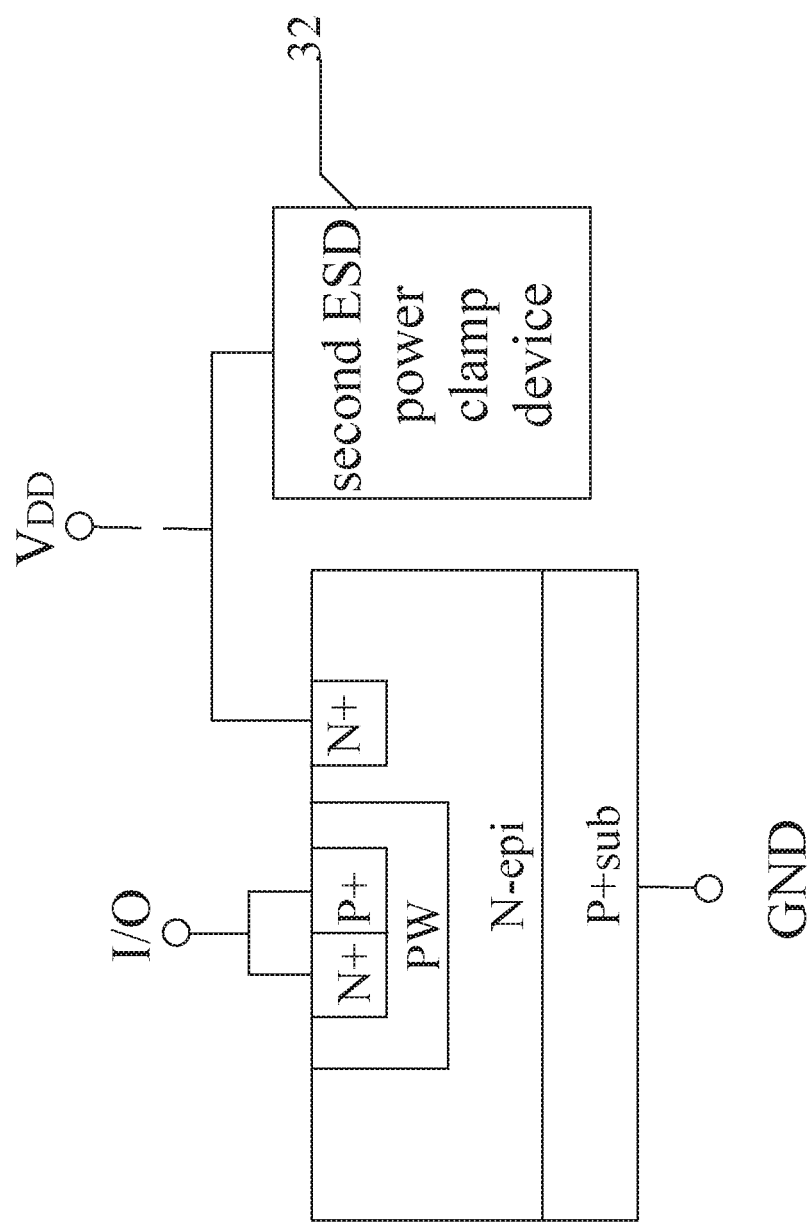
FIG. 19 shows one embodiment for implementing the fabrication of the circuit diagram of FIG. 14 in a vertical device.

FIG. 18 and FIG. 19 show variations of the proposed scheme depending on the embodiment in FIG. 17. The fabricating layouts are similar, while FIG. 17 shows the application of the present invention when implementing in a horizontal device, and FIG. 18-19 show the application of the present invention when implementing in a vertical device.

Regarding FIG. 18, the ESD protection circuit with low parasitic capacitance is implemented through a semiconductor structure comprising an n type heavily doped substrate N+sub, an n type epitaxial layer N-epi, a p type well PW, a first n type heavily doped region N+, a first p type heavily doped region P+, and a second p type heavily doped region P+. The n type epitaxial layer N-epi is formed on the n type heavily doped substrate N+sub. The p type well PW is provided in the n type epitaxial layer N-epi. The first n type heavily doped region N+ and the first p type heavily doped region P+ are disposed in the p type well PW and commonly connected to the I/O terminal. The second p type heavily doped region P+ is disposed in the n type epitaxial layer N-epi and connected to ground GND. The n type heavily doped substrate N+sub is connected to the second ESD power clamp device 32, and the n type heavily doped substrate N+sub and the second ESD power clamp device 32 are commonly connected to a high voltage level $V_{DD}$ or floating.

Regarding FIG. 19, the ESD protection circuit with low parasitic capacitance is implemented through a semiconductor structure comprising a p type heavily doped substrate P+sub, an n type epitaxial layer N-epi, a p type well PW, a first n type heavily doped region N+, a first p type heavily doped region P+, and a second n type heavily doped region N+. The n type epitaxial layer N-epi is formed on the p type heavily doped substrate P+sub. The p type well PW is provided in the n type epitaxial layer N-epi. The first n type heavily doped region N+ and the first p type heavily doped region P+ are disposed in the p type well PW and commonly connected to the I/O terminal. The p type heavily doped substrate P+sub is connected to ground GND. The second n type heavily doped region N+ is disposed in the n type epitaxial layer N-epi and connected to the second ESD power clamp device 32. And the second n type heavily doped region N+ and the second ESD power clamp device 32 are commonly connected to a high voltage level $V_{DD}$ or floating.

Nevertheless, the present invention is not limited to the above mentioned fabrication layouts. People skilled in the art are able to make modifications and variations based on the spirits of the present invention according to their actual product specifications, requirements, and so on, and yet still fall into the scope of the present invention.

Figure 20:
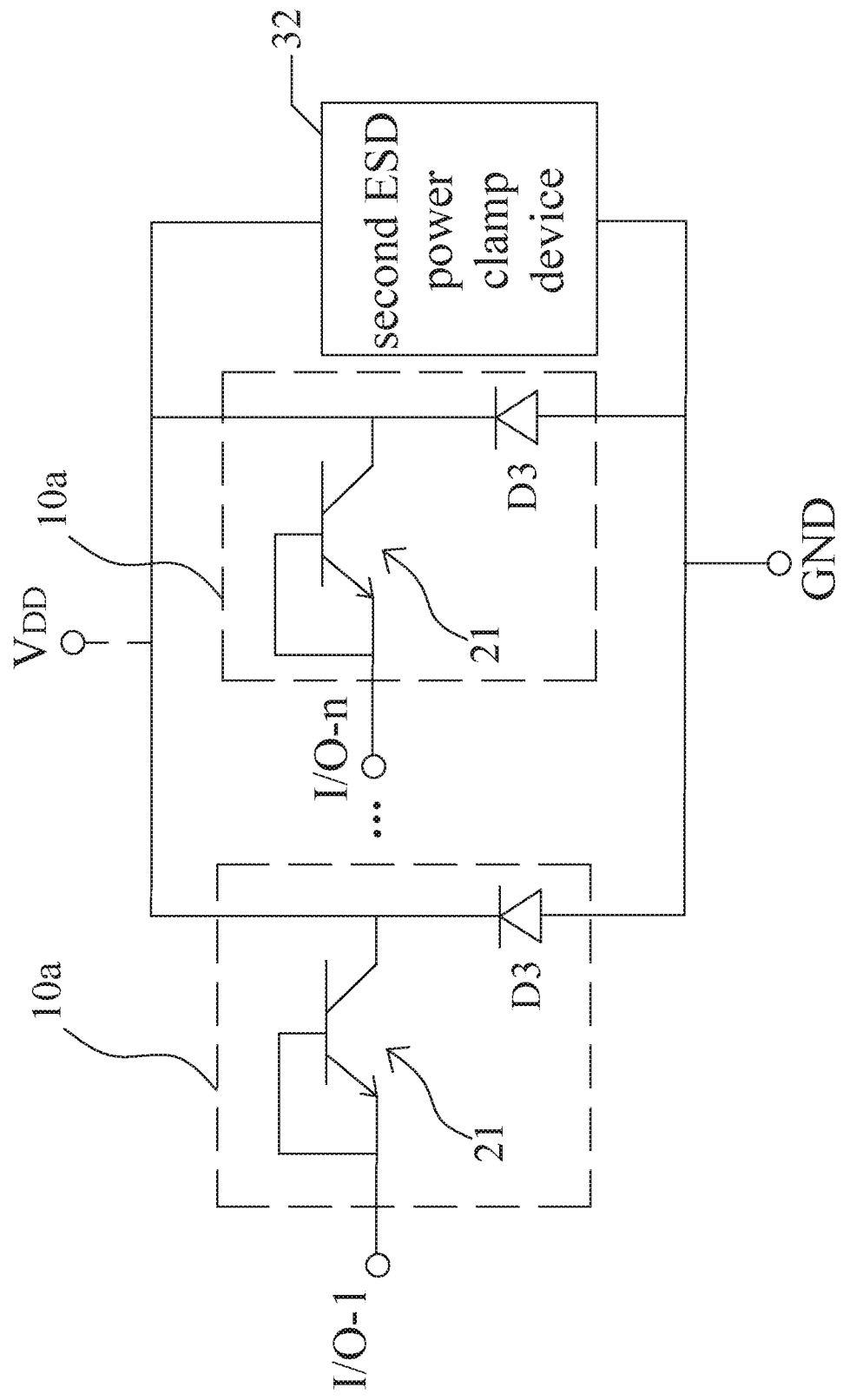
FIG. 20 shows a circuit diagram of the ESD protection circuit with low parasitic capacitance in accordance with the embodiment of the present invention in FIG. 14 when using a multi-channel design.

Furthermore, FIG. 20 shows a circuit diagram of the ESD protection circuit with low parasitic capacitance in accordance with the embodiment of the present invention in FIG. 14 when using a multi-channel design. In FIG. 20, it discloses a plurality of I/O terminals, I/O-1, . . . I/O-n, and each of the I/O terminals, I/O-1, . . . I/O-n is electrically connected with an ESD protection circuit 10a. The second ESD power clamp device 32 is electrically connected with the ESD protection circuit 10a so as to provide the new ESD protection path as illustrated earlier in the present invention.

Figure 21:
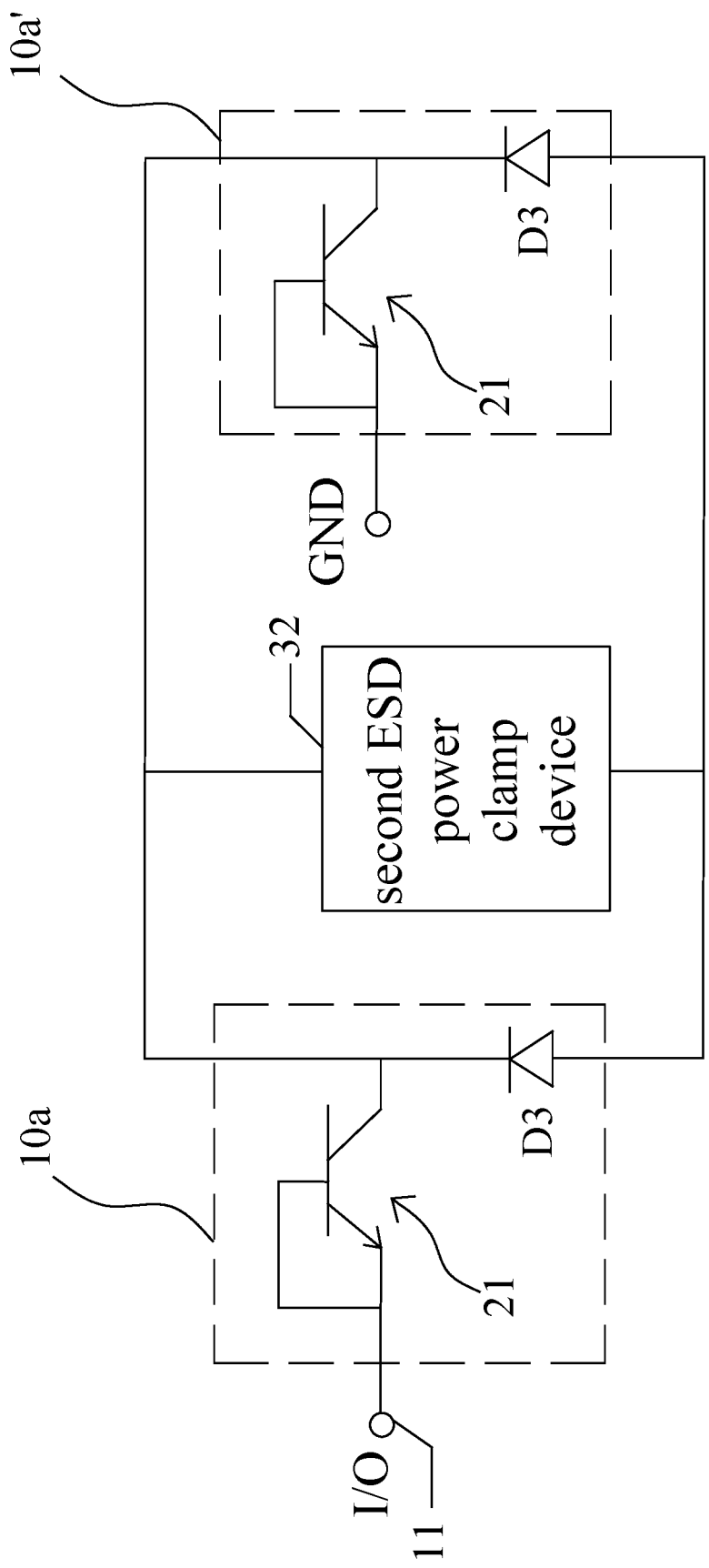
FIG. 21 shows a circuit diagram of the ESD protection circuit with low parasitic capacitance in accordance with the embodiment of the present invention in FIG. 14 when using a bi-directional design.

FIG. 21 shows a circuit diagram of the ESD protection circuit with low parasitic capacitance in accordance with the embodiment of the present invention in FIG. 14 when using a bi-directional design.

In FIG. 21, an Electrostatic discharge (ESD) protection structure with low parasitic capacitance is provided. The ESD protection structure with low parasitic capacitance is connected between an I/O terminal 11 and ground GND, and comprises a first ESD protection circuit 10a and a second ESD protection circuit 10a'. The first ESD protection circuit 10a and the second ESD protection circuit 10a' are similar to the first ESD protection circuit 10 and the second ESD protection circuit 10' in FIG. 13, respectively. The differences between the embodiments in FIG. 13 and FIG. 21 are: the first ESD power clamp device can be replaced by the diode element D3, and a second ESD power clamp device 32 is furthered connected between the first ESD protection circuit 10a and the second ESD protection circuit 10a'.

An anode of the diode element D3 is electrically connected to the second ESD power clamp device 32, and a cathode of the diode element D3 is electrically connected to the collector of the first bipolar junction transistor 21.

By such design manners, variation of embodiment is proposed to offer a bi-directional design of the present invention. It also proves that the present invention is able to be applicable to not only a bi-directional design, as shown in FIG. 21, but also able to a multi-channel design, comprising a plurality of I/O terminals, I/O-1, . . . I/O-n as shown in FIG. 20.

As a result, as compared to the prior design, it is believed that by such design manners as the above mentioned embodiments the present invention has disclosed, the parasitic junction capacitance of the ESD protection circuit is effectively decreased, thus solving the problems occurring in the prior design. Since the parasitic junction capacitance thereof can be effectively reduced, and efficiency of the ESD protection circuit structure is still well maintained, thus the Applicants assert that the present invention is instinct, effective and highly competitive for incoming technologies, industries and researches developed in the future and shall be patentable soon as well.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. An Electrostatic Discharge (ESD) protection circuit with low parasitic capacitance which is connected between an I/O terminal and ground, comprising:
a first bipolar junction transistor (BJT), wherein said first bipolar junction transistor is an NPN type of bipolar junction transistor, including a base and an emitter of said first bipolar junction transistor are commonly connected to said I/O terminal; and
a first ESD power clamp device, connected between a collector of said first bipolar junction transistor and said ground, such that when a positive ESD pulse or a negative ESD pulse is injected into said I/O terminal, an ESD protection path is provided with low parasitic capacitance, wherein when said negative ESD pulse is injected into said I/O terminal, said ESD protection path is formed consisting of a parasitic silicon controlled rectifier (SCR).

2. The Electrostatic Discharge (ESD) protection circuit with low parasitic capacitance of claim 1, wherein said collector of said first bipolar junction transistor is electrically connected to a high voltage level $V_{DD}$ or floating.

3. The Electrostatic Discharge (ESD) protection circuit with low parasitic capacitance of claim 1, wherein said first ESD power clamp device is a Zener diode.

4. The Electrostatic Discharge (ESD) protection circuit with low parasitic capacitance of claim 3, wherein said ESD protection circuit with low parasitic capacitance is implemented through a semiconductor structure comprising an n type substrate, a first p type well, a second p type well, a first n type heavily doped region, a first p type heavily doped region, a second n type heavily doped region, a second p type heavily doped region, and a third n type heavily doped region; said first p type well and said second p type well are provided in said n type substrate, said first n type heavily doped region and said first p type heavily doped region are disposed in said first p type well and commonly connected to said I/O terminal, said second n type heavily doped region and said second p type heavily doped region are disposed in said second p type well, said third n type heavily doped region is directly formed in said n type substrate and is electrically connected to said second n type heavily doped region in said second p type well, said second p type heavily doped region is connected to said ground, said third n type heavily doped region and said second n type heavily doped region are commonly connected to a high voltage level $V_{DD}$ or floating.

5. The Electrostatic Discharge (ESD) protection circuit with low parasitic capacitance of claim 1, wherein said first ESD power clamp device is a PNP type of bipolar junction transistor, said collector of said first bipolar junction transistor is electrically connected to an emitter of said PNP type of bipolar junction transistor, and a collector of said PNP type of bipolar junction transistor is electrically connected to said ground.

6. The Electrostatic Discharge (ESD) protection circuit with low parasitic capacitance of claim 5, wherein said ESD protection circuit with low parasitic capacitance is implemented through a semiconductor structure comprising an n type substrate, a first p type well, a first n type well, a first n type heavily doped region, a first p type heavily doped region, a second p type heavily doped region, a third p type heavily doped region, and a second n type heavily doped region; said first p type well and said first n type well are provided in said n type substrate, said first n type heavily doped region and said first p type heavily doped region are disposed in said first p type well and commonly connected to said I/O terminal, said second p type heavily doped region and said third p type heavily doped region are disposed in said first n type well, said second n type heavily doped region is directly formed in said n type substrate, said second p type heavily doped region is connected to said ground, said second n type heavily doped region is electrically connected to said third p type heavily doped region, said second n type heavily doped region formed in said n type substrate and said third p type heavily doped region disposed in said first n type well are commonly connected to a high voltage level $V_{DD}$ or floating.

7. The Electrostatic Discharge (ESD) protection circuit with low parasitic capacitance of claim 1, wherein said first ESD power clamp device is a second bipolar junction transistor as an NPN type of bipolar junction transistor, said collector of said first bipolar junction transistor is electrically connected to a collector of said second bipolar junction transistor, and a base and an emitter of said second bipolar junction transistor are commonly connected to said ground.

8. The Electrostatic Discharge (ESD) protection circuit with low parasitic capacitance of claim 7, wherein said ESD protection circuit with low parasitic capacitance is implemented through a semiconductor structure comprising an n type substrate, a first p type well, a third p type well, a first n type heavily doped region, a first p type heavily doped region, a second n type heavily doped region, a second p type heavily doped region, a third n type heavily doped region and a fourth n type heavily doped region; said first p type well and said third p type well are provided in said n type substrate, said first n type heavily doped region and said first p type heavily doped region are disposed in said first p type well and commonly connected to said I/O terminal, said second n type heavily doped region and said second p type heavily doped region are disposed in said third p type well and commonly connected to said ground, said fourth n type heavily doped region is directly formed in said n type substrate, said third n type heavily doped region is disposed in said third p type well, said fourth n type heavily doped region formed in said n type substrate is electrically connected to said third n type heavily doped region in said third p type well, and said third n type heavily doped region and said fourth n type heavily doped region are commonly connected to a high voltage level $V_{DD}$ or floating.

9. The Electrostatic Discharge (ESD) protection circuit with low parasitic capacitance of claim 1, wherein when said positive ESD pulse is injected into said I/O terminal, said ESD protection path is formed consisting of said first bipolar junction transistor and said first ESD power clamp device.

10. The Electrostatic Discharge (ESD) protection circuit with low parasitic capacitance of claim 1, wherein said first ESD power clamp device is replaced by a diode element, and a second ESD power clamp device is furthered connected in parallel with said diode element to provide a new ESD protection path when said positive ESD pulse is injected.

11. The Electrostatic Discharge (ESD) protection circuit with low parasitic capacitance of claim 10, wherein an anode of said diode element is electrically connected to said ground, and a cathode of said diode element is electrically connected to said collector of said first bipolar junction transistor.

12. The Electrostatic Discharge (ESD) protection circuit with low parasitic capacitance of claim 10, wherein said ESD protection circuit with low parasitic capacitance is implemented through a semiconductor structure comprising an n type substrate, a p type well, a first n type heavily doped region, a first p type heavily doped region, a second n type heavily doped region, and a second p type heavily doped region; said p type well is provided in said n type substrate, said first n type heavily doped region and said first p type heavily doped region are disposed in said p type well and commonly connected to said I/O terminal, said second p type heavily doped region is disposed in said n type substrate and connected to said ground, said second n type heavily doped region is disposed in said n type substrate and connected to said second ESD power clamp device, said second n type heavily doped region and said second ESD power clamp device are commonly connected to a high voltage level $V_{DD}$ or floating.

13. The Electrostatic Discharge (ESD) protection circuit with low parasitic capacitance of claim 10, wherein said ESD protection circuit with low parasitic capacitance is implemented through a semiconductor structure comprising an n type heavily doped substrate, an n type epitaxial layer, a p type well, a first n type heavily doped region, a first p type heavily doped region, and a second p type heavily doped region; said n type epitaxial layer is formed on said n type heavily doped substrate, said p type well is provided in said n type epitaxial layer, said first n type heavily doped region and said first p type heavily doped region are disposed in said p type well and commonly connected to said I/O terminal, said second p type heavily doped region is disposed in said n type epitaxial layer and connected to said ground, said n type heavily doped substrate is connected to said second ESD power clamp device, and said n type heavily doped substrate and said second ESD power clamp device are commonly connected to a high voltage level $V_{DD}$ or floating.

14. The Electrostatic Discharge (ESD) protection circuit with low parasitic capacitance of claim 10, wherein said ESD protection circuit with low parasitic capacitance is implemented through a semiconductor structure comprising a p type heavily doped substrate, an n type epitaxial layer, a p type well, a first n type heavily doped region, a first p type heavily doped region, and a second n type heavily doped region; said n type epitaxial layer is formed on said p type heavily doped substrate, said p type well is provided in said n type epitaxial layer, said first n type heavily doped region and said first p type heavily doped region are disposed in said p type well and commonly connected to said I/O terminal, said p type heavily doped substrate is connected to said ground, said second n type heavily doped region is disposed in said n type epitaxial layer and connected to said second ESD power clamp device, and said second n type heavily doped region and said second ESD power clamp device are commonly connected to a high voltage level $V_{DD}$ or floating.

15. The Electrostatic Discharge (ESD) protection circuit with low parasitic capacitance of claim 10, wherein when said positive ESD pulse is injected into said I/O terminal, said new ESD protection path is formed consisting of said first bipolar junction transistor and said second ESD power clamp device.

16. The Electrostatic Discharge (ESD) protection circuit with low parasitic capacitance of claim 10, wherein said second ESD power clamp device is a Zener diode, an NPN type of bipolar junction transistor, or a PNP type of bipolar junction transistor.

17. An Electrostatic Discharge (ESD) protection structure with low parasitic capacitance which is connected between an I/O terminal and ground, comprising:

a first ESD protection circuit, comprising a first bipolar junction transistor (BJT) and a first ESD power clamp device, wherein said first bipolar junction transistor is an NPN type of bipolar junction transistor, including a base and an emitter of said first bipolar junction transistor are commonly connected to said I/O terminal, and said first ESD power clamp device is connected to a collector of said first bipolar junction transistor; and a second ESD protection circuit, comprising said first bipolar junction transistor (BJT) and said first ESD power clamp device, wherein said first bipolar junction transistor is an NPN type of bipolar junction transistor, including a base and an emitter of said first bipolar junction transistor of said second ESD protection circuit are commonly connected to said ground, said first ESD power clamp device of said second ESD protection circuit is connected to a collector of said first bipolar junction transistor of said second ESD protection circuit, said first ESD power clamp device of said first ESD protection circuit is connected to said first ESD power clamp device of said second ESD protection circuit, and said collector of said first bipolar junction transistor of said first ESD protection circuit is connected to said collector of said first bipolar junction transistor of said second ESD protection circuit, so as to form a bi-directional design.

18. The Electrostatic Discharge (ESD) protection structure with low parasitic capacitance of claim 17, wherein said first ESD power clamp device is replaced by a diode element, and a second ESD power clamp device is furthered connected between said first ESD protection circuit and said second ESD protection circuit, an anode of said diode element is electrically connected to said second ESD power clamp device, and a cathode of said diode element is electrically connected to said collector of said first bipolar junction transistor.

\* \* \* \* \*